US012772533B2

(12) United States Patent
Padmanabhan et al.

(10) Patent No.: US 12,772,533 B2
(45) Date of Patent: Oct. 20, 2026

(54) SEMICONDUCTOR DEVICE TERMINATION STRUCTURES AND METHODS OF MANUFACTURING SEMICONDUCTOR DEVICE TERMINATION STRUCTURES

(71) Applicant: SEMICONDUCTOR COMPONENTS INDUSTRIES, LLC, Scottsdale, AZ (US)

(72) Inventors: Balaji Padmanabhan, Chandler, AZ (US); Prasad Venkatraman, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 485 days.

(21) Appl. No.: 18/454,328

(22) Filed: Aug. 23, 2023

(65) Prior Publication Data

US 2024/0088237 A1 Mar. 14, 2024

Related U.S. Application Data

(60) Provisional application No. 63/375,073, filed on Sep. 9, 2022.

(51) Int. Cl.

| | |
|---|---|
| ***H10D 30/66*** | (2025.01) |
| ***H10D 30/01*** | (2025.01) |
| ***H10D 62/17*** | (2025.01) |
| ***H10D 64/00*** | (2025.01) |

(Continued)

(52) U.S. Cl.

CPC ....... *H10D 64/117* (2025.01); *H10D 30/0297* (2025.01); *H10D 30/668* (2025.01); *H10D 62/307* (2025.01); *H10D 64/01* (2025.01); *H10D 64/513* (2025.01); *H10D 64/519* (2025.01)

(58) Field of Classification Search

CPC ............ H10B 12/033; H10D 30/0297; H10D 30/665; H10D 30/668; H10D 62/127; H10D 64/117; H10D 64/513; H10D 64/519

See application file for complete search history.

(56) References Cited

U.S. PATENT DOCUMENTS

| | | | |
|---|---|---|---|
| 10,361,276 | B1 | 7/2019 | Seok |
| 2006/0189063 | A1 | 8/2006 | Hueting et al. |

(Continued)

OTHER PUBLICATIONS

International Search Report, Application No. PCT/US2023/072883, mailed Dec. 20, 2023.

*Primary Examiner* — Eric A. Ward

(74) *Attorney, Agent, or Firm* — Kevin B. Jackson

(57) ABSTRACT

In an example, a semiconductor device includes an active trench region and an intersecting trench. The active region includes an active shield electrode and the intersecting trench includes an intersecting shield electrode. A coupling trench region connects the active trench region to the intersecting trench region. The coupling trench region includes a coupling shield electrode. The coupling shield electrode and the intersecting shield electrode are provided proximate to a termination mesa region. One or more of the coupling shield electrode or the intersecting shield electrode is thinner than the active shield electrode. The thinner shield electrode reduces depletion in the termination mesa region to improve, among other things, breakdown voltage performance.

20 Claims, 16 Drawing Sheets

10

(51) Int. Cl.

| | |
|---|---|
| ***H10D 64/01*** | (2025.01) |
| ***H10D 64/27*** | (2025.01) |

(56) References Cited

U.S. PATENT DOCUMENTS

| | | | | |
|---|---|---|---|---|
| 2007/0155104 | A1* | 7/2007 | Marchant | H10D 30/668 257/E29.136 |
| 2013/0181283 | A1 | 7/2013 | Sato | |
| 2015/0048445 | A1 | 2/2015 | Noebauer et al. | |
| 2019/0006512 | A1* | 1/2019 | Wu | H10D 30/665 |
| 2020/0083366 | A1 | 3/2020 | Venkatraman et al. | |
| 2022/0223729 | A1* | 7/2022 | Kondo | H10D 64/117 |
| 2023/0113308 | A1 | 4/2023 | Padmanabhan et al. | |

* cited by examiner

SEMICONDUCTOR DEVICE TERMINATION STRUCTURES AND METHODS OF MANUFACTURING SEMICONDUCTOR DEVICE TERMINATION STRUCTURES

CROSS-REFERENCE TO RELATED APPLICATIONS

This application claims priority from U.S. Provisional Application No. 63/375,073 filed on Sep. 9, 2022, which hereby incorporated by reference in its entirety.

TECHNICAL FIELD

The present disclosure relates, in general, to electronics and, more particularly, to semiconductor device termination structures and methods of forming semiconductor devices having termination structures, such as shielded gate trench MOSFET devices.

BACKGROUND

As semiconductor devices, such as shield gate trench metal oxide field effect transistor (MOSFET) devices, are reduced in size, it has become difficult to integrate additional shield contact structures within an MOSFET cell topography to achieve reduced shield electrode resistance without detrimentally impacting other MOSFET characteristics. A low shield resistance is desired to provide a MOSFET with low gate bounce, good unclamped inductive switching (UIS) performance, and higher operating efficiency. For proper device functioning, structures and methods are desired that facilitate reduced shield resistance without adversely affecting the breakdown voltage of the device.

Figure 1:
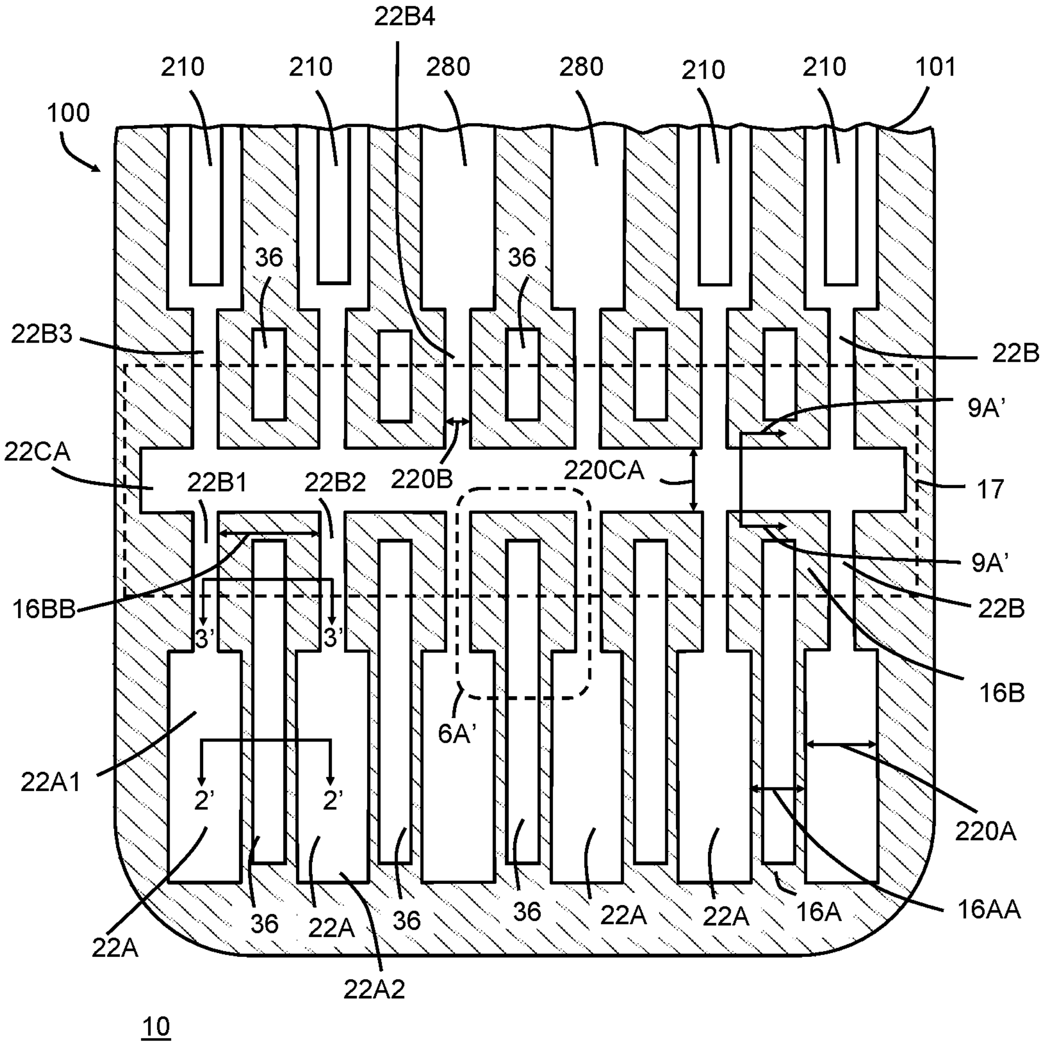
FIG. 1 illustrates a partial top plan view of an example cell topography of a semiconductor device in accordance with the present description.

The following discussion provides various examples of semiconductor devices and methods of manufacturing semiconductor devices. Such examples are non-limiting, and the scope of the appended claims are not to be limited to the examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions, dielectric regions, or trench regions may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, considering any necessary polarity reversal of voltages, inversion of transistor type and/or current direction, etc.

In addition, the terminology used herein is for the purpose of describing examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", "including", "has", "have" and/or "having" when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections are not limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DESCRIPTION

Insulated gate field effect transistors (IGFETs), such as metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an N-type enhancement mode MOSFET, turn-on occurs when a conductive N-type inversion layer (i.e., channel region) is formed in a P-type body region in response to the application of a positive gate voltage, which exceeds an inherent threshold voltage. The inversion layer connects N-type source regions to N-type drain regions and allows for majority carrier conduction between these regions.

There is a class of MOSFET devices referred as trench MOSFET devices. In a trench MOSFET device, a gate electrode is formed in a trench that extends downward (e.g., vertically downward) from a major surface of a semiconductor material such as silicon. Further, a shield electrode may be formed below the gate electrode in the trench and is insulated by one or more dielectrics. Current flow in a trench MOSFET device is primarily vertical (e.g., in an N-type conductivity doped drift region) and, as a result, device cells can be more densely packed.

A device cell may, for example, include a trench that contains the gate electrode and an adjoining mesa that contains the drain, source, body, and channel regions of the device. An example trench MOSFET device may include an array of hundreds or thousands of device cells (each including a trench and an adjoining mesa). A device cell may be referred to herein as a trench-mesa cell because each device cell geometrically includes a trench structure and a mesa structure (or two half mesas).

Packing several device cells together increases the current carrying capability and reduces on-resistance of the device. In addition, in trench MOSFET devices that include a shield electrode, the shield electrode can require low shield resistance to provide, among other things, low gate bounce, good unclamped inductive switching performance, and higher efficiencies in applications. However, as next generation trench MOSFETs target cell pitches that are fractions of a micron (e.g., about 0.65 μm) and mesa widths approximately half of the target cell pitch (e.g., of about 0.32 μm), such feature size reductions result in an increase in the shield resistance.

One approach to reducing shield resistance has been to provide multiple shield electrode contacts along the length of a trench between two gate feeds. One disadvantage of this approach is that it requires a break in the gate feed layer and thus, does not allow for an efficient addition of shield contacts between two gate feeds. Another approach to address this issue is to include an intersecting trench region oriented perpendicularly to the active trench regions with both the gate feed layers and the shield feed layers with gate feed pass-through trenches in the shield contact areas of the cell. However, in some MOSFET devices, such as medium voltage MOSFET devices (for example, voltages between about 30 to about 80 volts), the intersecting trench regions can cause a reduction in breakdown voltage ($BV_{DSS}$) performance resulting from, for example, charge imbalance and three-dimensional depletion regions.

Solutions for addressing this $BV_{DSS}$ performance issue are described herein. The disclosure describes structures and cell topographies that address, among other things, charge imbalance and three-dimensional depletion region issues with intersecting trenches in power MOSFET devices.

In an example, a semiconductor device includes a region of semiconductor material. A first active trench region extends inward into the region of semiconductor material and includes an active shield electrode in the first active trench region, which is separated from the region of semiconductor material by an active shield electrode dielectric. A second active trench region extends inward into the region of semiconductor material, is laterally spaced apart from and parallel to the first active trench region and includes the active shield electrode in the second active trench region, which is separated from the region of semiconductor material by the active shield electrode dielectric. An intersecting trench region extends inward into the region of semiconductor material and is perpendicular to the first active trench region and the second active trench region. A first coupling trench region couples the first active trench region to the intersecting trench region. The first coupling trench region includes a coupling shield electrode in first coupling trench region, which is separated from the region of semiconductor material by a coupling shield electrode dielectric. A second coupling trench region coupling the second active trench region to the intersecting trench region. The second coupling trench region includes the coupling shield electrode in the second coupling trench region, which is separated from the region of semiconductor material by the coupling shield electrode dielectric. The active shield electrode comprises a first thickness in a first cross-sectional view, the coupling shield electrode comprises a second thickness in the first cross-sectional view, and the second thickness is less than the first thickness.

In an example, a semiconductor device includes a region of semiconductor material comprising a top side and a first conductivity type. A first active trench region within the region of semiconductor material and comprising an active shield electrode separated from the region of semiconductor material by an active shield electrode dielectric. An intersecting trench region within the region of semiconductor material and perpendicular to the first active trench region and comprising an intersecting shield electrode separated from the region of semiconductor material by an intersecting shield electrode dielectric. A first coupling trench region within the region of semiconductor material coupling the first active trench region to the intersecting trench region and including a coupling shield electrode separated from the region of semiconductor material by a coupling shield electrode dielectric. The active shield electrode comprises a first thickness in a first cross-sectional view, the coupling shield electrode comprises a second thickness in the first cross-sectional view, the intersecting shield electrode comprises a third thickness in a second cross-sectional view, and one or more of the second thickness or the third thickness is less than the first thickness.

In an example, a method of manufacturing a semiconductor device includes providing a region of semiconductor material. The method includes providing a first active trench region extending inward into the region of semiconductor material and including an active shield electrode in the first active trench region and separated from the region of semiconductor material by an active shield electrode dielectric. The method providing a second active trench region extending inward into the region of semiconductor material, laterally spaced apart from and parallel to the first active trench region and including the active shield electrode in the second active trench region and separated from the region of semiconductor material by the active shield electrode dielectric. The method includes providing an intersecting trench region extending inward into the region of semiconductor material and perpendicular to the first active trench region and the second active trench region. The method includes providing a first coupling trench region coupling the first active trench region to the intersecting trench region and including a coupling shield electrode separated from the region of semiconductor material by a coupling shield electrode dielectric. The method includes providing a second coupling trench region coupling the second active trench region to the intersecting trench region and including the coupling shield electrode in the second coupling trench region and separated from the region of semiconductor material by the coupling shield electrode dielectric. The active shield electrode comprises a first thickness in a first cross-sectional view, the coupling shield electrode comprises a second thickness in the first cross-sectional view, and the second thickness is less than the first thickness.

Other examples are included in the present disclosure. Such examples may be found in the figures, in the claims, or in the description of the present disclosure.

Figure 3:
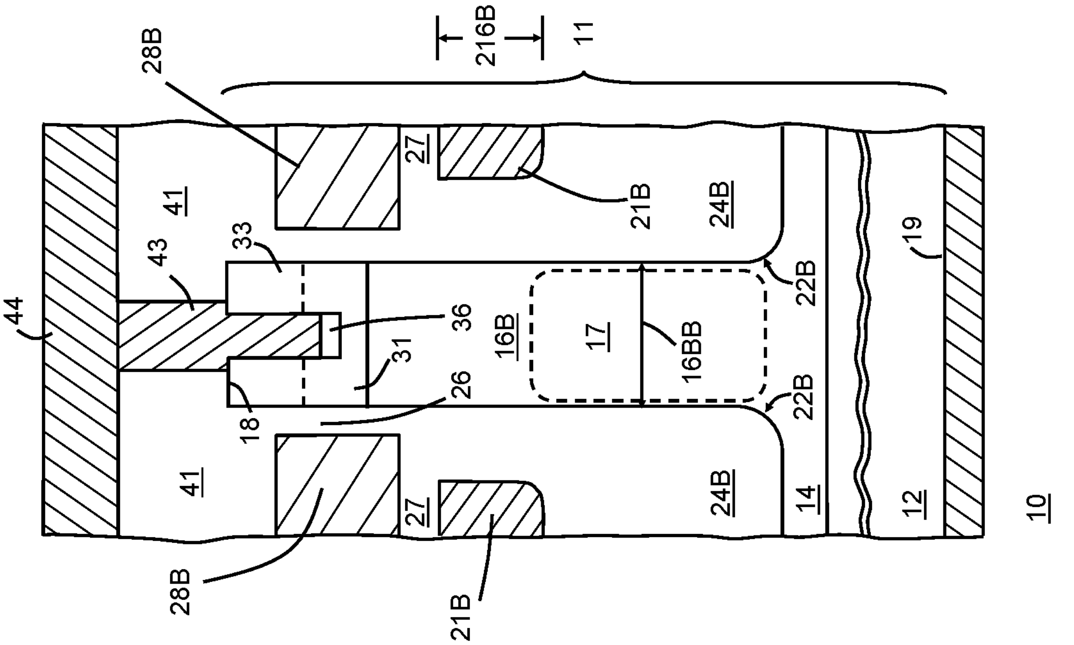
FIG. 3 illustrates a partial cross-sectional view of the semiconductor device of FIG. 1 and the semiconductor device of FIG. 4 taken along reference line 3'-3' in accordance with the present description.
Figure 2:
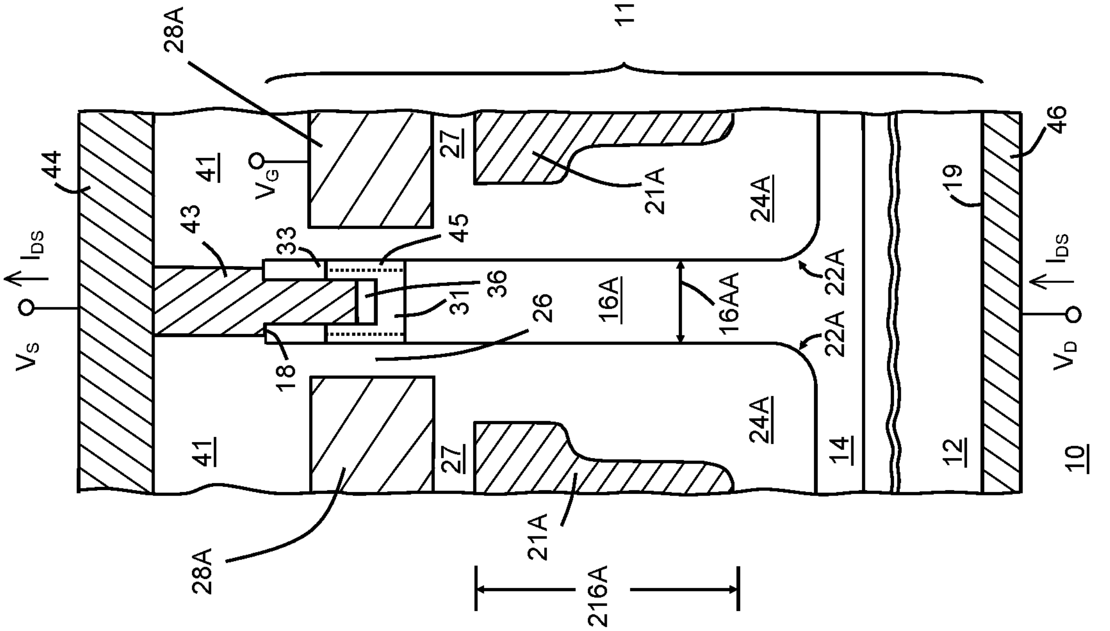
FIG. 2 illustrates a partial cross-sectional view of the semiconductor device of FIG. 1, the semiconductor device of FIG. 4, the semiconductor device of FIG. 5, and the semiconductor device of FIG. 7A taken along reference line 2'-2' in accordance with the present description.
Figure 9A:
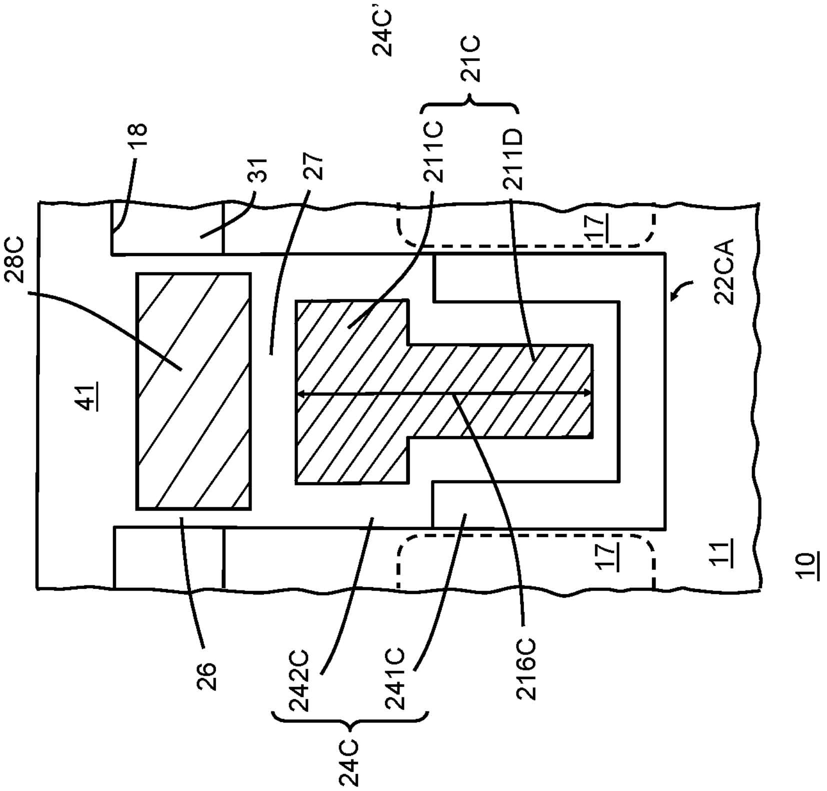
FIG. 9A illustrates a partial cross-sectional view of the semiconductor device of FIG. 1 and the semiconductor device of FIG. 7A taken along reference lines 9A'-9A' in accordance with the present description.

FIG. 1 illustrates a partial top plan view of a cell topography 100 of a semiconductor device 10 in accordance with the present description. FIG. 2 illustrates a partial cross-sectional view of semiconductor device 10 taken along reference line 2'-2' of FIG. 1 including active trench regions 22A bounding an active mesa region 16A, and FIG. 3 illustrates a partial cross-sectional view of semiconductor device 10 taken along reference line 3'-3' of FIG. 1 including coupling trench regions 22B bounding a termination mesa region 16B. FIG. 9A illustrates a partial cross-sectional view of semiconductor device 10 taken along reference line 9A'-9A' of FIG. 1 including an intersecting trench region 22CA. Cell topography 100 can also be referred to as a device layout or cell layout, and semiconductor device 10 can also be referred to as a semiconductor component, an electronic device structure, or an electronic component. In some examples, cell topography 100 is suitable for medium voltage devices, such as 30 volt to 80 volt MOSFET devices. However, the structures and method described herein are relevant to structures using charge balance structures or where three-dimensional depletion regions are an issue.

In accordance with the present description, semiconductor device 10 is configured to facilitate multiple shield contact trenches 210 to provide reduced shield electrode resistance while maintaining breakdown voltage ($BV_{DSS}$). Semiconductor device 10 is shown as an N-channel MOSFET device, but it is understood that the structures and methods of the present description can be used for other types of semiconductor devices, such as insulated gate bipolar transistor (IGBT) devices. In other examples, semiconductor device 10 can be a P-channel MOSFET device by reversing the conductivity types of the various regions described hereinafter.

Cell topography 100 is illustrated as a half-cell and a full cell can be provided by duplicating the half-cell illustrated and rotating it, for example, 180 degrees with respect to reference line 101 and adjoining the upper portion to the lower portion along reference line 101. As known by those of ordinary skill in the art, cell topography 100 is duplicated multiple times as part of a photolithographic reticle set or a mask set to provide a desired cell density for semiconductor device 10.

In the present example, cell topography 100 comprises active trench regions 22A, coupling trench regions 22B, and an intersecting trench region 22CA. Active trench regions 22A are configured for active regions of semiconductor device 10 and coupling trench regions 22B and intersecting trench region 22CA are configured as part of a termination structure for semiconductor device 10. In some examples, intersecting trench region 22CA is generally perpendicular to active trench regions 22A and coupling trench regions 22B connects active trench region 22A to intersecting trench region 22CA. In the present example, active trench regions 22A comprise an active trench region width 220A, coupling trench regions 22B comprise a coupling trench region width 220B, and intersecting trench region 22CA comprises an intersecting trench region width 220CA. In the present example, coupling trench region width 220B is less than active trench region width 220A and intersecting trench region width 220CA. Active trench region 22A1 is an example of a first active region, active trench regions 22A2 is an example of a second active trench region, coupling trench region 22B1 is an example of a first coupling trench region, and coupling trench region 22B2 is an example of a second coupling trench region. Second active trench region 22A2 is laterally spaced part from first active trench region 22A1 and is parallel to first active trench region 22A1.

Coupling trench region 22B3 is an example of a third coupling trench region coupling a shield contact trench 210 to intersecting trench region 22CA. Coupling trench region 22B4 is an example of a coupling trench region coupling a gate contact trench 280 to intersecting trench region 22CA.

With cell topography 100, semiconductor device 10 is provided with termination mesa regions 16B, which are interposed between adjacent coupling trench regions 22B (for example, interposed between first coupling trench region 22B1 and second coupling trench region 22B2) and abut intersecting trench region 22CA, which runs perpendicular to coupling trench regions 22B. In addition, semiconductor device 10 comprises active mesa regions 16A, which are interposed between adjacent active trench regions 22A (for example, between first active trench region 22A1 and second active trench region 22A2). In the present example, termination mesa regions 16B comprise a termination mesa region width 16BB and active mesa regions 16A comprise an active mesa region width 16AA. In the present example, active mesa region width 16AA is less than termination mesa region width 16BB. In some examples, semiconductor device 10 comprises a doped region 17 in portions of termination mesa regions 16B. Doped regions 17 are configured to control charge balance within termination mesa regions 16B and can be either P-type conductivity or N-type conductivity.

Cell topography 100 comprises shield contact trenches 210 and gate contact trenches 280. Plurality of shield contact trenches 210 can also be referred to as a plurality of shield trenches, and plurality of gate contact trenches 280 can be referred to as a plurality of gate trenches. In the present example, coupling trench regions 22B also connect shield contact trenches 210 and gate contact trenches 280 to intersecting trench region 22CA. Cell topography 100 also comprises body contact regions 36 provided interposed between active trench regions 22A and coupling trench regions 22B. Body contact regions 36 are spaced apart from active trench regions 22A, coupling trench regions 22B, and intersecting trench region 22CA.

With reference now to FIGS. 2, 3, and 9A, in some examples, semiconductor device 10 comprises a region of semiconductor material 11, which may also be referred to as a body of semiconductor material, a semiconductor work piece, a semiconductor region, or a semiconductor material. As illustrated in FIGS. 2 and 3, in some examples region of semiconductor material 11 can comprise a substrate 12, such as an N-type silicon substrate, and a semiconductor region 14 adjacent to substrate 12. Substrate 12 can also be referred to as a semiconductor substrate or starting substrate and semiconductor region 14 can also be referred to as a semiconductor layer(s) or an extended drain region. In some examples, substrate 12 has a resistivity ranging from about 0.0005 ohm-cm to about 0.005 ohm-cm. By way of example, substrate 12 can be doped with phosphorous, arsenic, or antimony. In the example illustrated, substrate 12 provides a drain region, drain contact, or a first current carrying contact for semiconductor device 10. Region of semiconductor material 11 comprises a major surface 18 and a major surface 19 opposite to major surface 18. Major surface 18 can also be referred to as a top side or an upper side and major surface 19 can also be referred to as a back side or a lower side.

In some examples, semiconductor region 14 can be formed using semiconductor epitaxial growth techniques. Alternatively, semiconductor region 14 can be formed using semiconductor doping and diffusion techniques. In an example suitable for a 50 volt device, semiconductor region 14 can comprise an N-type conductivity and a dopant concentration of about $1.0\times10^{16}$ atoms/cm$^3$ to about $5.0\times10^{17}$ atoms/cm$^3$ and can have a thickness from about 3 microns to about 5 microns. The dopant concentration and thickness of semiconductor region 14 can be increased or decreased depending on the desired drain-to-source breakdown voltage ($BV_{DSS}$) rating of semiconductor device 10. In some examples, semiconductor region 14 can comprise a graded dopant profile. In an alternate example, the conductivity type of substrate 12 can be opposite to the conductivity type of semiconductor region 14 to form, for example, an IGBT semiconductor device.

As illustrated in FIG. 2, active trench regions 22A extend inward from major surface 18 into region of semiconductor material 11 and are separated from each other by active mesa regions 16A having active mesa widths 16AA. Active trench regions 22A comprise active shield electrodes 21A in central and lower portions of active trench regions 22A, which are separated from region of semiconductor material 11 by an active shield dielectric 24A. In some examples, active shield electrodes 21A comprise a stepped shape in cross-sectional view as illustrated in FIG. 2. In other examples, active shield electrodes 21A can comprise other shapes including, but not limited to, sloped shapes, linear shapes, or non-stepped shapes. Active trench regions 22A also comprise active gate electrodes 28A in upper portions of active trench regions 22A, which are separated from active shield electrode 21A by an inter-electrode dielectric 27. Active gate electrodes 28A are laterally separated from region of semiconductor material 11 by gate dielectric 26. Active shield electrodes 21A comprise an active shield electrode thickness 216A, which may also be referred to as an active shield electrode height. In some examples, active mesa region 16A is interposed between first active trench region 22A1 and second active trench region 22A2.

With momentary reference to FIG. 9A, intersecting trench region 22CA extends inward from major surface 18 into region of semiconductor material 11. Intersecting trench region 22CA comprises an intersecting shield electrode 21C in a central and a lower portion of intersecting trench region, which is separated from region of semiconductor material 11 by intersecting shield dielectric 24C. Intersecting trench region 22CA also comprises an intersecting gate electrode 28C, which is separated from intersecting shield electrode 21C by inter-electrode dielectric 27. Intersecting gate electrode 28C is laterally separated from region of semiconductor material 11 by gate dielectric 26. Intersecting shield electrode 21C comprises an intersecting shield electrode thickness 216C, which may also be referred to as an intersecting shield electrode height. In the present example, active shield electrodes 21A and intersecting shield electrode 21C can be similar including similar in dimensions and shape. In some examples, active shield electrode thickness 216A and intersecting shield electrode thickness 216C are substantially equal. Active shield electrode thickness 216A is an example of a first thickness and intersecting shield electrode thickness 216C is an example of a third thickness.

In some examples, active shield electrode thickness 216A is in a range from about 0.8 microns to about 10 microns. In some examples, coupling shield electrode thickness 216B is in a range from about 0.5 microns to about 5 microns. In some examples, intersecting shield electrode thickness 216C is in a range from 0.5 microns to about 10 microns.

With reference now to FIG. 3, coupling trench regions 22B extend inward from major surface 18 into region of semiconductor material 11 and are separated from each other by termination mesa region 16B having termination mesa region width 16BB. That is, termination mesa region 16B is interposed between first coupling trench region 22B1 and second coupling trench region 22B2. As illustrated in FIG. 1, termination mesa region 16B abuts or adjoins intersecting trench region 22CA. Coupling trench regions 22B comprise coupling shield electrodes 21B in central or middle portions of coupling trench regions 22B and are separated from region of semiconductor material 11 by a coupling shield dielectric 24B. Coupling trench regions 22B also comprise coupling gate electrodes 28B in upper portions of coupling trench regions 22B, which are separated from coupling shield electrodes 21B by inter-electrode dielectric 27. In some examples, coupling gate electrodes 28B are laterally separated from region of semiconductor material 11 by gate dielectric 26. In accordance with the present description, coupling shield electrodes 21B comprise a coupling shield electrode thickness 216B that is less than active shield electrode thickness 216A. Coupling shield electrode thickness 216B is an example of a second thickness. In the present example, coupling shield electrode thickness 216B also is less than intersecting shield electrode thickness 216C. Coupling shield electrode thickness 216B may also be referred to as a coupling shield electrode height. In accordance with the present example, coupling shield electrodes 21B are within the central portions of coupling trench regions 22B but are not within a lower portion of coupling trench regions 22B. That is, the lower portions of coupling trench regions 22B are devoid of coupling shield electrodes 21B.

It was observed experimentally that with intersecting trench region 22CA intersecting active trench regions 22A without coupling trench regions 22B and coupling shield electrodes 21B, there is a three-dimensional depletion region that forms compared to a two-dimensional depletion region in active trench region 22A away from intersecting trench region 22CA. The three-dimensional depletion results in an over depletion condition in termination mesa regions 16B that leads to a lower $BV_{DSS}$. In accordance with the present example and description, coupling trench region 22B with thinner or shorter coupling shield electrodes 21B near the intersection with intersecting trench region 22CA alters the depletion region within termination mesa region 16B. In some examples, the thinner coupling shield electrodes 21B reduces the depletion caused by a thicker shield electrode, which results in a higher $BV_{DSS}$.

In some examples, active gate electrode 28A, coupling gate electrode 28B, and intersecting gate electrode 28C are coupled together and can comprise the same material, such as a doped polycrystalline semiconductor material. In some examples, active shield electrode 21A, coupling shield electrode 21B, and intersecting shield electrode 21C are coupled together and can comprise the same materials, such as a doped polycrystalline semiconductor material. In some examples, the doped polycrystalline semiconductor materials can be doped polysilicon. In some examples, N-type conductivity dopant materials can be used to dope the polysilicon. In some examples, metals, silicides, or other conductors can be included as part of active gate electrode 28A, coupling gate electrode 28B, intersecting gate electrode 28C, active shield electrode 21A, coupling shield electrode 21B, or intersecting shield electrode 21C.

Active shield dielectric 24A, coupling shield dielectric 24B, and intersecting shield dielectric 24C can be one or more dielectric or insulative materials. In some examples, active shield dielectric 24A and coupling shield dielectric 24B can be about a 0.1 micron to about 1.5 micron thermal oxide layer. In some examples, active shield dielectric 24A, coupling shield dielectric 24B, and intersecting shield dielectric 24C can be multiple layers of similar or different materials, such as thermal and deposited dielectric or insulative materials. The thickness of the shield dielectrics will vary with the required $BV_{DSS}$ of the device, with higher $BV_{DSS}$ requiring thicker layers.

Gate dielectric 26 and inter-electrode dielectric 27 can comprise oxides, nitrides, tantalum pentoxide, titanium dioxide, barium strontium titanate, high k dielectric materials, combinations thereof, or other related or equivalent materials known by one of ordinary skill in the art. In some examples, gate dielectric 26 and inter-electrode dielectric 27 can be silicon oxide. In some examples, gate dielectric 26 can have a thickness from about 0.02 microns to about 0.1 microns, and inter-electrode dielectric 27 can have a thickness that is greater than that of gate dielectric 26. In some examples, active shield dielectric 24A, coupling shield dielectric 24B, or intersecting shield dielectric 24C can have a greater thickness than gate dielectric 26 and inter-electrode dielectric 27.

As further illustrated in FIG. 2, FIG. 3, and FIG. 9A, semiconductor device 10 comprises a body region 31 extending inward from major surface 18 into region of semiconductor material 11 (for example, extending inward into semiconductor region 14) adjacent to active trench regions 22A. Body region 31 can also be referred to as a doped region or a base region. Body region 31 can have a conductivity type that is opposite to the conductivity type of semiconductor region 14. For example, when semiconductor region 14 comprises N-type conductivity, body region 31 comprises P-type conductivity. Body region 31 comprises a dopant concentration suitable for forming inversion layers that operate as channel regions 45 for semiconductor device 10. In some examples, body region 31 can extend from major surface 18 to a depth from about 0.3 microns to about 1.5 micron. Body region 31 can be formed using doping techniques, such as ion implantation and anneal techniques. In some examples, body region 31 is single continuous and interconnected region. In other examples, body region 31 can be a plurality of regions including separated regions.

With reference to FIGS. 2 and 3, semiconductor device 10 can further comprise doped regions 33 within body region 31 in active mesa region 16A. In some examples, doped region 33 can be optionally included within body region 31 in termination mesa region 16B. That is, in some examples, doped regions 33 are not included in body region 31 in termination mesa regions 16B so that termination mesa region 16B is devoid of doped regions 33. Doped regions 33 may also be referred to as source regions, current carrying regions, or current conducting regions. Doped regions 33 comprise an N-type conductivity when body region 31 comprises a P-type conductivity and can be formed using, for example, a phosphorous or arsenic dopant source. In some examples, an ion implant doping process can be used to form doped regions 33 within body region 31. Doped regions 33 can extend from major surface 18 to a depth for example, from about 0.2 microns to about 0.5 microns.

With reference to FIG. 3 and FIG. 9A, in some examples, doped region 17 is included within termination mesa region 16B. In some examples, doped region 17 has the same conductivity type (for example, N-type conductivity) as semiconductor region 14. In other examples, doped region 17 has the opposite conductivity type (for example, P-type conductivity) to semiconductor region 14. In some examples, the peak dopant concentration of doped region 17 can be greater than the peak dopant concentration of semiconductor region 14. In some examples, the peak dopant concentration can be about 20 percent to about 150 percent greater than the peak dopant concentration of semiconductor region 14. In some examples, doped region 17 can be formed using ion implantation and anneal processes. In other examples, the placement and shape of doped region 17 can be different than what is illustrated in FIG. 3 and FIG. 9A. For example, doped region 17 can be larger or smaller and/or can be in a different part of termination mesa region 16B. In other examples, doped region 17 can comprise a plurality of separately doped portions. The dimensions and dopant concentration of doped region 17 can be used in conjunction with other features of the present description including shorter coupling shield electrodes 21B to provide a desired $BV_{DSS}$ characteristic for semiconductor device 10.

In some examples, semiconductor device 10 further comprises interlayer dielectric (ILD) 41 above active gate electrode 28A, above coupling gate electrode 28B, and above intersecting gate electrode 28C. In some examples, interlayer dielectric 41 comprises silicon oxides, such as doped or undoped deposited silicon oxides. In some examples, interlayer dielectric 41 can include one layer of deposited silicon oxide doped with phosphorous or boron and phosphorous and one layer of undoped oxide. In some examples, interlayer dielectric 41 can have a thickness from about 0.25 microns to about 1.0 microns. In some examples, interlayer dielectric 41 can be planarized to provide a more uniform surface topography, which improves manufacturability.

In some examples, semiconductor device 10 further comprises body contact regions 36 within body region 31. body contact regions 36 also can be referred to as doped regions, enhancement regions, or contact regions. In some examples, body contact region 36 can comprise P-type conductivity and are configured to provide a lower contact resistance to body regions 31. Ion implantation (for example, using boron) and anneal techniques can be used to form body contact regions 36.

In some examples, semiconductor device 10 further comprises conductive regions 43, which are configured to provide electrical contact to doped regions 33 and body region 31 through body contact regions 36. Active gate electrodes 28A, coupling gate electrodes 28B, and intersecting gate electrode 28C can be connected to one or more gate contact trenches 280 and active shield electrodes 21A, coupling shield electrodes 21B, and intersecting shield electrode 21C can be connected to one or more shield contact trenches 210. In some examples, conductive regions 43 comprise conductive plugs or plug structures. In some examples, conductive regions 43 can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. In some examples, the conductive fill material includes tungsten. In some examples, conductive regions 43 can be planarized to provide a more uniform surface topography.

In some examples, a conductor 44 can be formed adjacent to major surface 18, and a conductor 46 can be formed adjacent to major surface 19. Conductor 44 can also be referred to as a top metal or a top conductor, and conductor 46 can also be referred to as a bottom conductor or a back metal. Conductors 44 and 46 can be configured to provide electrical connection between the individual cells of semiconductor device 10 and a next level of assembly. In some examples, conductor 44 comprises titanium/titanium-nitride/aluminum-copper or other related or equivalent materials known by one of ordinary skill in the art and is configured as a source electrode or terminal. In some examples, conductor 46 comprises a solderable metal structure such as titanium-nickel-silver, chromium-nickel-gold, or other related or equivalent materials known by one of ordinary skill in the art and is configured as a drain electrode or terminal. In some examples, a further passivation layer (not shown) can be formed adjacent to conductor 44. In some examples, active shield electrode 21A, coupling shield electrode 21B, and intersecting shield electrode 21C can be connected to conductor 44 so that active shield electrode 21A, coupling shield electrode 21B, and intersecting shield electrode 21C are configured to be at the same potential as doped regions 33 when semiconductor device 10 is in use. In other examples, active shield electrode 21A, coupling shield electrode 21B, or intersecting shield electrode can be configured to be independently biased or coupled in part to gate contact trenches 280.

Figure 6B:
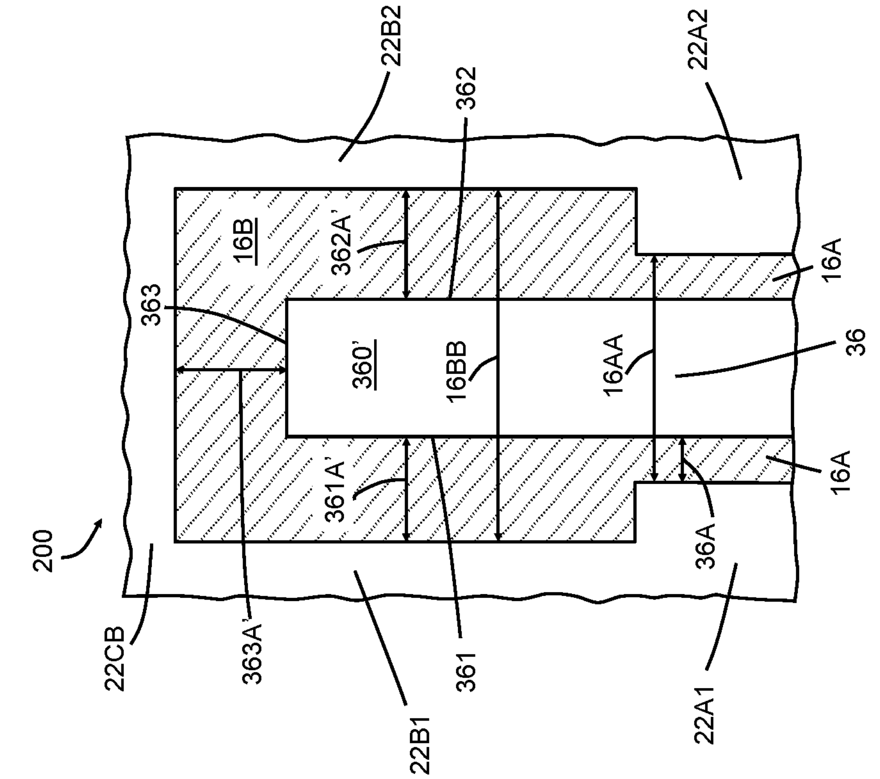
FIG. 6B illustrates an enlarged partial top plan view of a portion 6B' referenced in FIG. 4 in accordance with the present description.
Figure 6A:
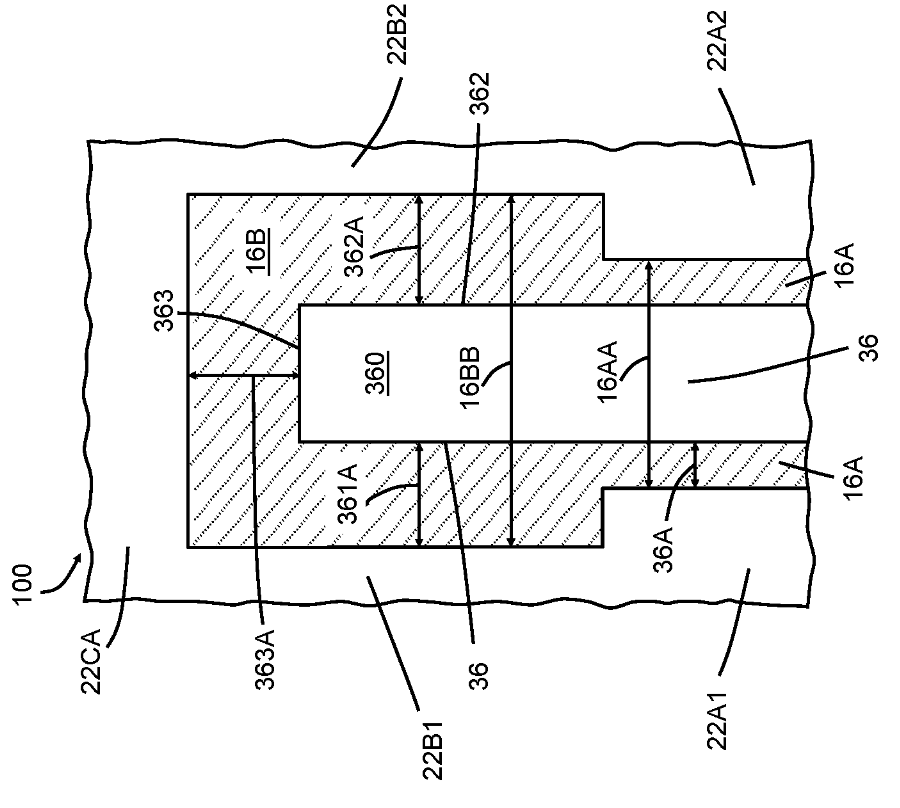
FIG. 6A illustrates an enlarged partial top plan view of a portion 6A' referenced in FIG. 1 in accordance with the present description.

FIG. 6A illustrates an enlarged partial top plan view of portion 6A' of cell topography 100 of FIG. 1. In some examples, body contact region 36 comprises a tip region 360 within termination mesa region 16B. Tip region 360 comprises a lateral side 361, a lateral side 362 opposite to lateral side 361, and an end 363 connecting lateral side 361 to lateral side 362. End 363 can also be referred to as a distal end or an outermost end of body contact region 36 with respect to active mesa region 16A. Lateral side 361 can be an example of a first lateral side and lateral side 362 can be an example of a second lateral side.

Lateral side 361 is laterally spaced apart from first coupling trench region 22B1 a distance 361A, lateral side 362 is laterally spaced apart from second coupling trench region 22B2 a distance 362A, and end 363 is laterally spaced apart from intersecting trench region 22CA a distance 363A. Body contact region 36 is laterally spaced apart from first active trench region 22A1 a distance 36A (which is also the distance between body contact region 36 and second active trench regions 22A2). In the present example, distances 361A, 362A, and 363A are greater than distance 36A. In the present example, termination mesa region width 16BB of termination mesa region 16B is greater than active mesa region width 16AA of active mesa region 16A. This provides termination mesa region 16B in tip region 360 with a higher concentration of charge to further facilitate charge balancing for semiconductor device 10, which further improves $BV_{DSS}$ performance.

In an example, the operation of semiconductor device 10 can proceed as follows. If conductor 44 and shield electrodes 21A, 21B, and 21C are operating at a potential $V_S$ of zero volts, gate electrodes 28A, 28B, and 28C would receive a control voltage $V_G$ of 10 volts, which is greater than the conduction threshold of semiconductor device 10 and drain electrode (or output terminal) 46 would operate at a drain potential $V_D$ of less than 2.0 volts. The values of $V_G$ and $V_S$ would cause body region 31 to invert adjacent to gate electrodes 28A to form channel regions 45, which would electrically connect doped regions 33 to semiconductor region 14 in active mesa regions 16A. A device current $I_{DS}$ would flow from conductor 46 and would be routed through semiconductor region 14, channel regions 45, and doped regions 33 to conductor 44. In some examples, $I_{DS}$ is on the order of 10.0 amperes. To switch semiconductor device 10 to the off state, a control voltage $V_G$ that is less than the conduction threshold of semiconductor is applied. Such a control voltage would remove channel regions 45 and $I_{DS}$ would no longer flow through semiconductor device 10. In accordance with the present description the configuration of semiconductor device 10 as described herein achieves improved $BV_{DSS}$ performance due to the structural attributes of thinner or shorter coupling shield electrodes 21B, which reduces the depletion in the termination mesa regions and overcomes over-depletion proximate to the intersecting trench region. In addition, doped region 17 supports improved $BV_{DSS}$ performance through charge balance techniques. Further, the dimensions of termination mesa region 16B support improved $BV_{DSS}$ performance through charge balance techniques.

In other examples, the lengths of coupling trench regions 22B can be varied to further optimize $BV_{DSS}$ performance. In addition, doped region 17 can be included to increase drift region charge in the termination mesa regions. The dopant concentration of doped region 17 can be varied to optimize $BV_{DSS}$ performance. In addition, the lateral lengths of coupling trench regions 22B can be different than the lateral lengths of doped region 17. That is, some portions of coupling trench regions 22B proximate to intersecting trench region 22CA can have doped region 17 and other portions of coupling trench regions 22B proximate to active trench regions 22A can be devoid of doped region 17. These variations further provide design flexibility to optimize $BV_{DSS}$. These attributes can be used within any of the topographies described herein.

Figure 4:
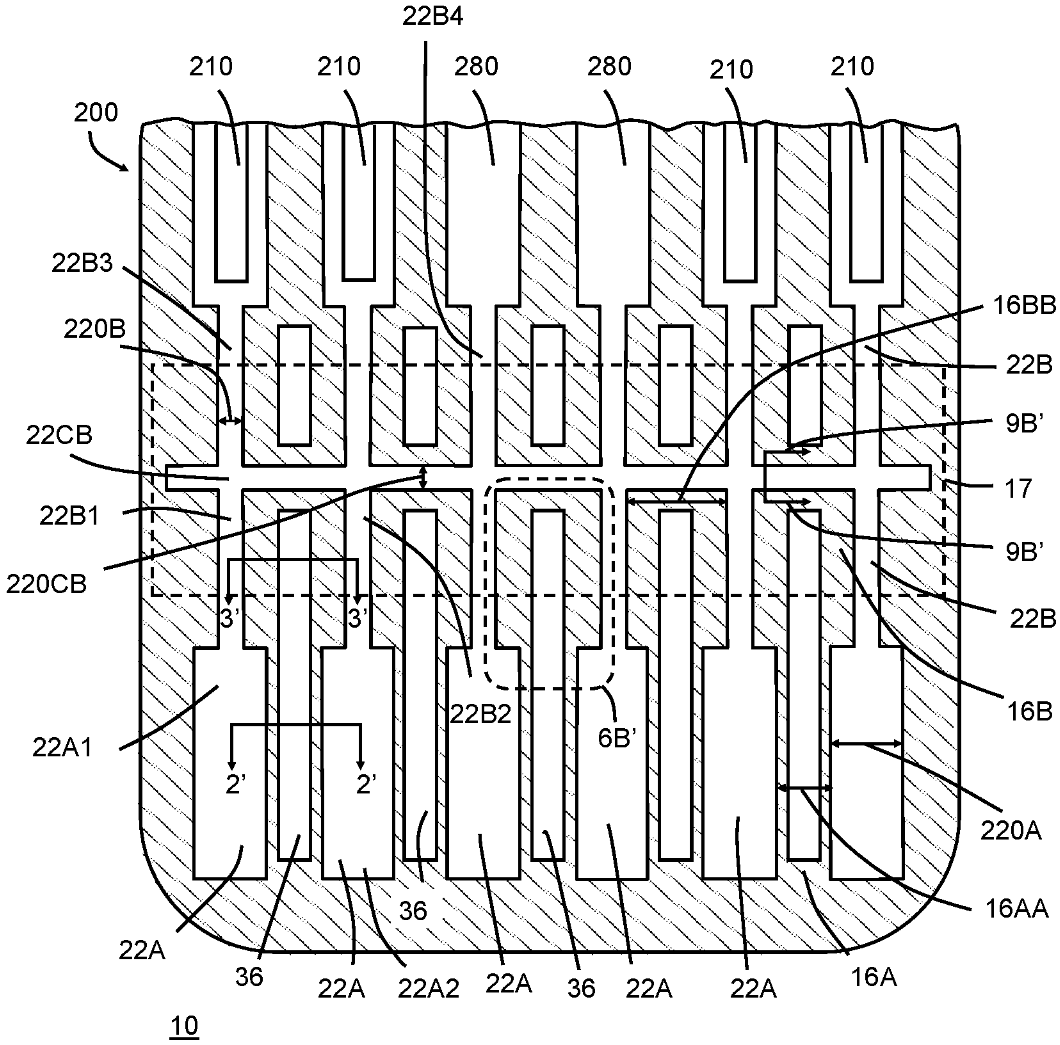
FIG. 4 illustrates a partial top plan view of an example of a cell topography of a semiconductor device in accordance with the present description.
Figure 9B:
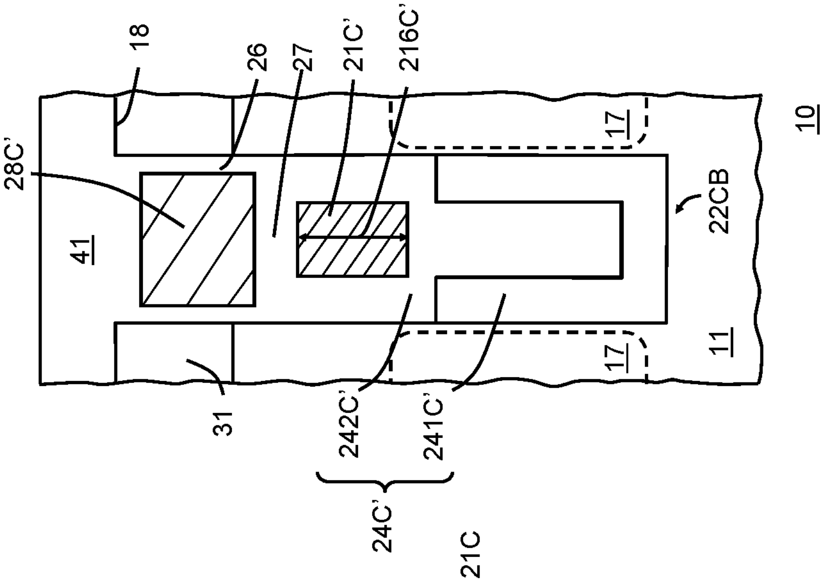
FIG. 9B illustrates a partial cross-sectional view of the semiconductor device of FIG. 4, the semiconductor device of FIG. 5, and the semiconductor device of FIG. 7A taken along reference lines 9B'-9B' in accordance with the present description.

FIG. 4 illustrates a partial top plan view of a cell topography 200 for semiconductor device 10 in accordance with the present description. Cell topography 200 can also be referred to as a device layout or a cell layout. FIG. 2 illustrates a partial cross-sectional view of semiconductor device 10 taken along reference line 2'-2' of cell topography 200 of FIG. 4 including active trench regions 22A, and FIG. 3 illustrates a partial cross-sectional view of semiconductor device 10 taken along reference line 3'-3' of cell topography 200 of FIG. 4 including coupling trench regions 22B. FIG. 9B illustrates a partial cross-sectional view of semiconductor device 10 taken along reference line 9B'-9B' of the cell topography 200 of FIG. 4 including an intersecting trench region 22CB. FIG. 6B illustrates an enlarged partial top plan view of portion 6B' of cell topography 200. Cell topography 200 comprises similar features to cell topography 100 and those similar features are not repeated here.

With reference to FIG. 4 and FIG. 9B, in the present example semiconductor device 10 comprises intersecting trench region 22CB that comprises an intersecting trench region width 220CB. In some examples, intersecting trench region width 220CB is less than active trench region width 220A. In some examples, intersecting trench region width 220CB can be similar to coupling trench region width 220B. With the reduced width, intersecting trench region 22CB comprises an intersecting shield electrode 21C' having an intersecting shield electrode thickness 216C' that is thinner than active shield electrode thickness 216A, and that can be similar to coupling shield electrode thickness 216B. In some examples, intersecting shield electrode thickness 216C' is equal to coupling shield electrode thickness 216B. Intersecting shield electrode thickness 216C' is an example of third thickness and coupling shield electrode thickness is an example of a second thickness.

In accordance with the present description, intersecting shield electrode 21C' is within a central portion of intersecting trench region 22CB but is not within a lower portion of intersecting trench region 22CB. That is, the lower portion of intersecting trench region 22CB is devoid of intersecting shield electrode 21C'. In the present example, coupling shield electrodes 21B and intersecting shield electrode 21C' are shorter or thinner than active shield electrodes 21A. Intersecting shield electrode 21C' is separated from region of semiconductor material by intersecting shield dielectric 24C', which is thicker than intersecting shield dielectric 24C illustrated in FIG. 9A. In accordance with the present description, shorter intersecting shield electrode 21C' further reduces the effects of three-dimensional depletion thereby improving the $BV_{DSS}$ performance of semiconductor device 10.

With reference to FIG. 6B, tip region 360' in cell topography 200 can be longer than tip region 360 in cell topography 100. Similar to tip region 360, tip region 360' comprises lateral side 361, lateral side 362, and end 363. In some examples, distances 361A', 362A', and 363A' can be similar to distances 361A, 362A, and 363A of tip region 360. In other examples, one or more distances 361A', 362A', or 363A' can be different than distances 361A, 362A, and 363A. In the present example, distances 361A', 362A', and 363A' are greater than distance 36A. In the present example, termination mesa region width 16BB of termination mesa region 16B is greater than active mesa region width 16AA of active mesa region width 16A. This provides termination mesa region 16B in tip region 360' with a higher concentration of charge to further facilitate charge balancing for semiconductor device 10, which further improves $BV_{DSS}$ performance.

Figure 5:
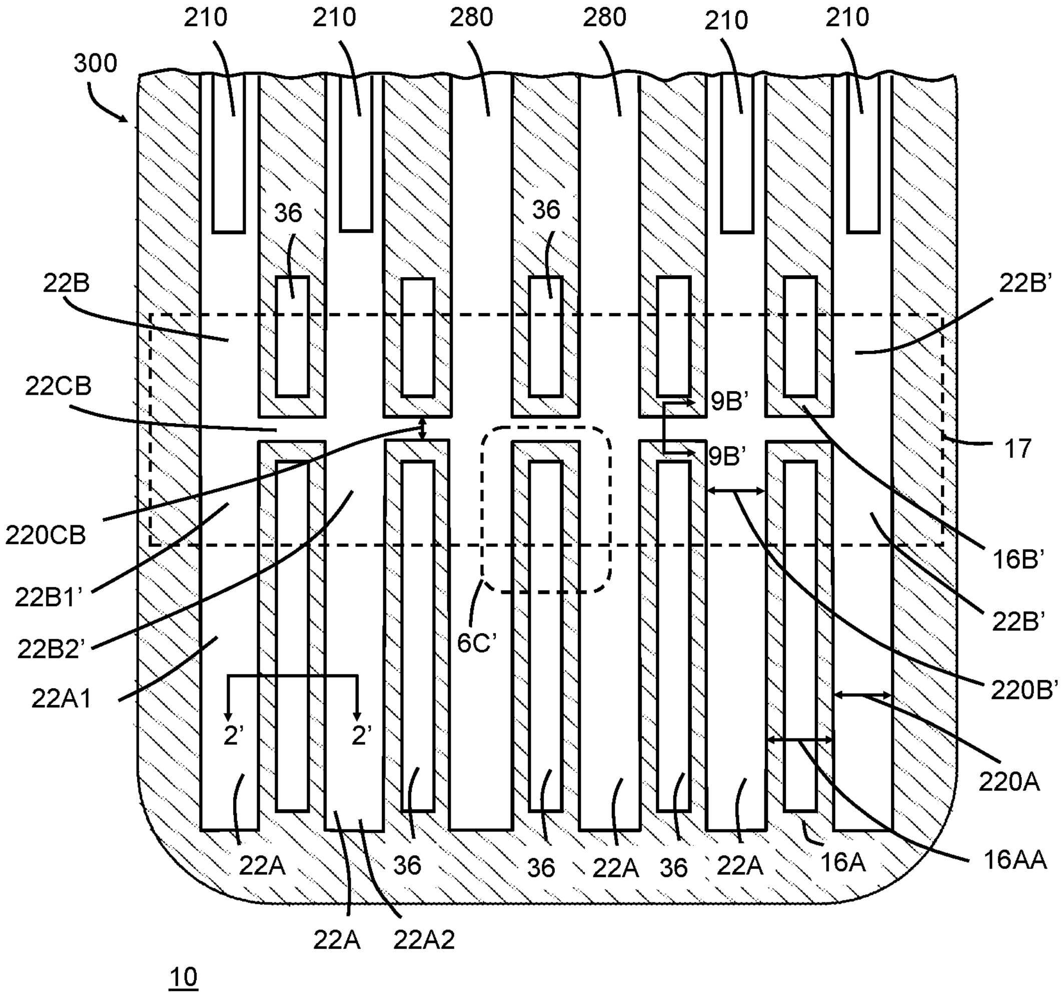
FIG. 5 illustrates a partial top plan view of an example of a cell topography of a semiconductor device in accordance with the present description.
Figure 6C:
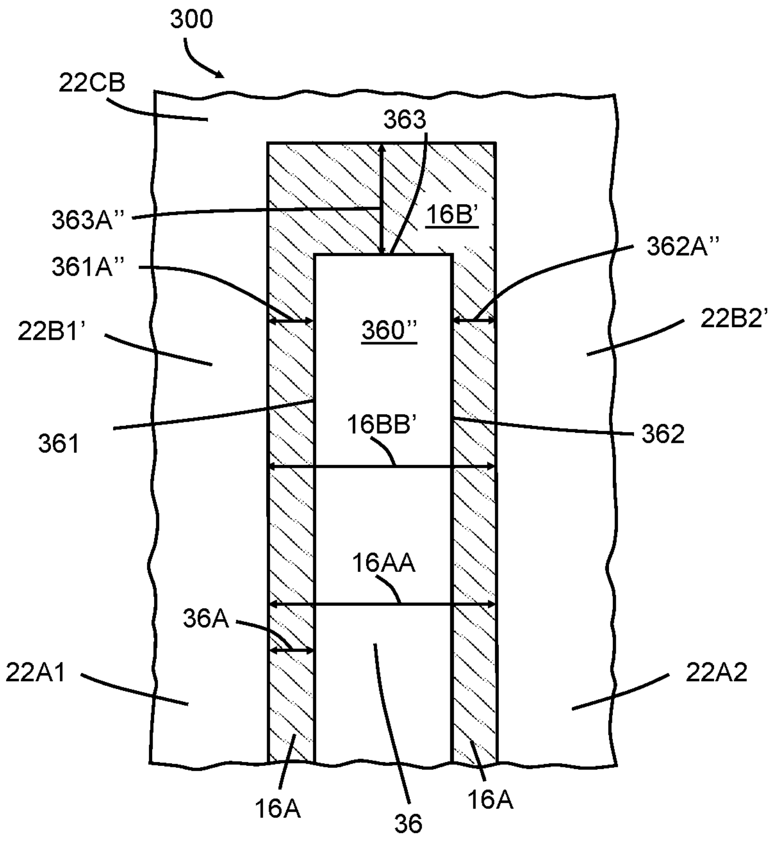
FIG. 6C illustrates an enlarged partial top plan view of a portion 6C' referenced in FIG. 5 in accordance with the present description.

FIG. 5 illustrates a partial top plan view of a cell topography 300 for semiconductor device 10 in accordance with the present description. Cell topography 300 can also be referred to as a device layout or a cell layout. FIG. 2 illustrates a partial cross-sectional view of semiconductor device 10 taken along reference line 2'-2' of cell topography 300 of FIG. 5 including active trench regions 22A, and FIG. 9B illustrates a partial cross-sectional view of semiconductor device 10 taken along reference line 9B'-9B' of cell topography 300 of FIG. 5 including intersecting trench region 22CB. FIG. 6C illustrates an enlarged partial top plan view of portion 6C' of cell topography 300. Cell topography 300 comprises similar features to cell topography 100 and cell topography 200 and those similar features are not repeated here.

With reference to FIG. 5 and FIG. 9B, in the present example semiconductor device 10 comprises coupling trench regions 22B' having a coupling trench region width 220B' and intersecting trench region 22CB having intersecting trench region width 220CB. In the present example, coupling trench region width 220B' is greater than intersecting trench region width 220CB. In some examples, coupling trench region width 220B's can be similar to active trench region width 220A so that coupling trench regions 22B' have a coupling shield electrode similar to active shield electrode 21A. As illustrated in FIG. 9B, intersecting trench region 22CB comprises intersecting shield electrode 21C', which is thinner or shorter than active shield electrode 21A and the coupling shield electrode. In accordance with the present description, shorter intersecting shield electrode 21C' reduces the effects of three-dimensional depletion thereby improving the $BV_{DSS}$ performance of semiconductor device 10. Coupling trench region 22B1' can be an example of a first coupling trench region and coupling trench region 22B2' can be an example of a second coupling trench region. In some examples, termination mesa region 16B' is smaller than termination mesa region 16B of cell topography 100 and cell topography 200.

With reference to FIG. 6C, tip region 360" in cell topography 300 comprises lateral side 361, lateral side 362, and end 363. In the present example, lateral side 361 is laterally spaced apart from first coupling trench region 22B1' a distance 361A", lateral side 362 is laterally spaced apart from second coupling trench region 22B2' a distance 362A" and end 363 is laterally spaced apart from intersecting trench region 22CB a distance 363A". In the present example, termination mesa region width 16BB' of termination mesa region 16B' is similar to active mesa region width 16AA of active mesa region 16A, and thus the charge in termination mesa region 16BB' is similar to the charge in active mesa region 16A. In the present example, shorter intersecting shield electrode 21C' and doped region 17 provide $BV_{DSS}$ performance improvement.

Figure 7A:
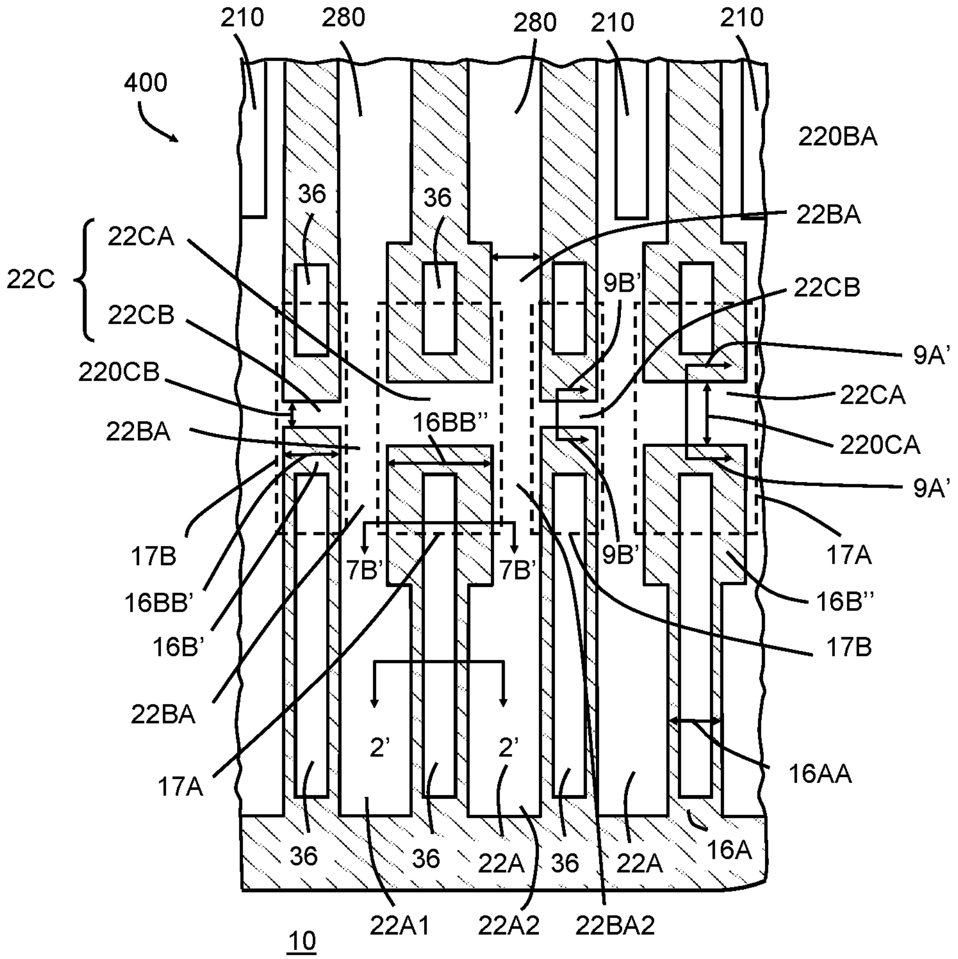
FIG. 7A illustrates a partial top plan view of an example of a cell topography of a semiconductor device in accordance with the present description.
Figure 7B:
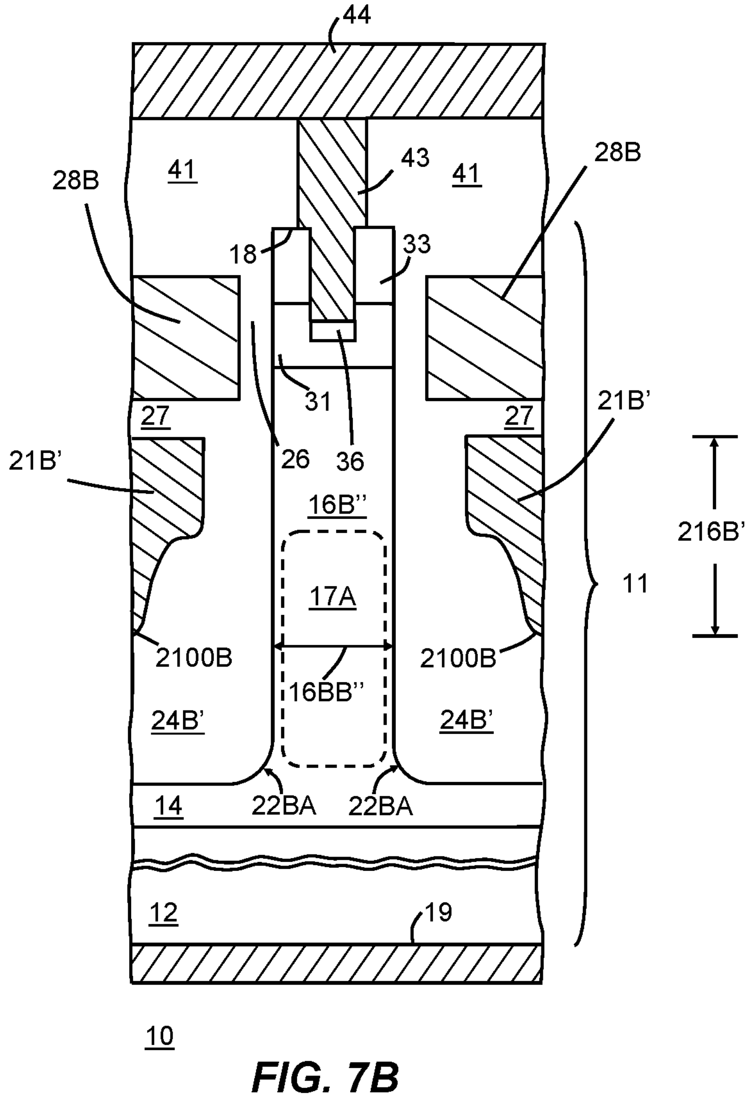
FIG. 7B. illustrates a partial cross-sectional view of the semiconductor device of FIG. 7A taken along reference line 7B'-7B'.

FIG. 7A illustrates a partial top plan view of a cell topography 400 for semiconductor device 10 in accordance with the present description. Cell topography 400 can also be referred to as a device layout or a cell layout. FIG. 2 illustrates a partial cross-sectional view of semiconductor device 10 taken along reference line 2'-2' of cell topography 400 of FIG. 7A including active trench regions 22A, FIG. 7B illustrates a partial cross-sectional view of semiconductor device 10 taken along reference line 7B'-7B' of cell topography 400 of FIG. 7A including coupling trench regions 22BA, FIG. 9A illustrates a partial cross-sectional view of semiconductor device 10 taken along reference line 9A'-9A' of cell topography 400 of FIG. 7A including intersecting trench region 22CA, and FIG. 9B illustrates a partial cross-sectional view of semiconductor device 10 taken along reference line 9B'-9B' including intersecting trench region 22CB. Cell topography 400 comprises similar features to cell topography 100, cell topography 200, and cell topography 300 and those similar features are not repeated here.

In the present example, semiconductor device 10 comprises an intersecting trench region 22C that includes one or more intersecting trench regions 22CA and one or more intersecting trench regions 22CB. In some examples, intersecting trench region 22CA can be referred to as a first portion of intersecting trench region 22C and intersecting trench region 22CB can be referred to as a second portion of intersecting trench region 22C. Intersecting trench region 22CA comprises intersecting trench region width 220CA and intersecting trench region 22CB comprises intersecting trench region width 220CB, which is less than intersecting trench region width 220CA. Intersecting trench region width 220CA is an example of a first width and intersecting trench region width 220CB is an example of a second width less than the first width.

In the present example, intersecting trench region 22CA comprises intersecting shield electrode 21A (FIG. 9A) and intersecting trench region 22CB comprises intersecting shield electrode 21C' (FIG. 9B), which is thinner or shorter than intersecting shield electrode 21C. Intersecting shield electrode 21C is an example of a first intersecting shield electrode having a third thickness and intersecting shield electrode 21C' is an example of a second intersecting shield electrode having a fourth thickness that is less than the third thickness. In the present example, intersecting shield electrode 21C can be similar to active shield electrode 21A.

In the present example, semiconductor device 10 comprises coupling trench regions 22BA, which have a coupling trench region width 220BA. Coupling trench region width 220BA is greater than intersecting trench region width 220CB but less than intersecting trench region width 220CA. In the present example, coupling trench region width 220BA is less than active trench region width 220A. In the present example, coupling trench region width 220BA is greater than coupling trench region width 220B in cell topography 100 but less than coupling trench region width 220B' of cell topography 300.

With reference to FIG. 7A and FIG. 7B, coupling trench region 22BA comprises a coupling shield electrode 21B' having a coupling shield electrode thickness 216B'. Coupling shield electrode thickness 216B' can also be referred to as a coupling shield electrode height. In the present example, coupling shield electrode thickness 216B' is greater than intersecting shield electrode thickness 216C' (FIG. 9B) but less than intersecting shield electrode thickness 216C (FIG. 9A). In the present example, coupling shield electrode thickness 216B' is less than active shield electrode thickness 216A. In the present example, coupling shield electrode 21B' is separated from region of semiconductor material 11 by coupling shield dielectric 24B'. Coupling shield electrodes 21B' are in a central portion of coupling trench regions 22BA and include a lower surface 2100B that extends partially into lower portions of coupling trench regions 22BA. In accordance with the present description, coupling shield electrodes 21B' and intersecting shield electrodes 21C' are shorter shield electrodes compared to active shield electrodes 21A which help reduce the effects of three-dimensional depletion thereby improving $BV_{DSS}$ performance.

In the present example, portions of semiconductor device 10 of cell topography 400 comprise termination mesa regions 16B" having termination mesa region widths 16B", which are larger than active mesa region width 16A. In those portions of semiconductor device 10 having this configuration, termination mesa regions 16B" comprise a higher concentration of charge compared to active mesa regions 16A to provide charge balancing, which together with shorter coupling shield electrodes 21B' improve $BV_{DSS}$ performance.

In the present example, other portions of semiconductor device 10 of cell topography 400 comprise termination mesa regions 16B' having termination mesa region widths 16BB', which are similar to active mesa region width 16A and, thus, have similar charge concentrations. In those portions of semiconductor device 10 having this configuration, shorter coupling shield electrode 21B' and shorter intersecting shield electrode 21C' provide improved $BV_{DSS}$ performance.

Cell topography 400 is configured with doped regions 17A and doped regions 17B in termination mesa regions 16B" and 16B' respectively. In some examples, doped regions 17A and doped regions 17B have different peak dopant concentrations, which provides design flexibility for controlling charge balance in the different termination mesa regions 16B' and 16B" of semiconductor device 10. This further improves $BV_{DSS}$ performance.

FIGS. 8A, 8B, 8C, 8D, 8E, 8F, 8G, 8H, 8I, 8J, 8K, 8L, 8M, and 8N illustrate partial cross-sectional views of semiconductor device 10 at various stages of manufacturing in accordance with the present description. FIGS. 8A, 8C, 8E, 8G, 8I, 8K, and 8M illustrate portions of semiconductor device 10 corresponding to an active trench region, such as one of active trench regions 22A. FIGS. 8B, 8D, 8F, 8H, 8J, 8L, and 8N illustrate portions of semiconductor device 10 corresponding to a coupling trench region, such as one of coupling trench regions 22B. It is understood that similar manufacturing steps can be used to provide coupling trench regions 22B' of FIG. 5 (for examples, steps illustrated in FIGS. 8A, 8C, 8E, 8G, 8I, 8K, and 8M). For coupling trench regions 22BA of FIG. 7A, similar steps can be used with a trench having a width in between those illustrated, for example, in FIGS. 8A and 8B. It is further understood that the steps illustrated in FIGS. 8A, 8C, 8E, 8G, 8I, 8K, and 8M can be used to provide intersecting shield electrode 21C illustrated in FIG. 9A and that the steps illustrated in FIGS.

8B, 8D, 8F, 8H, 8J, 8L, and 8N can be used to provide intersecting shield electrode 21C' illustrated in FIG. 9B.

Figure 8B:
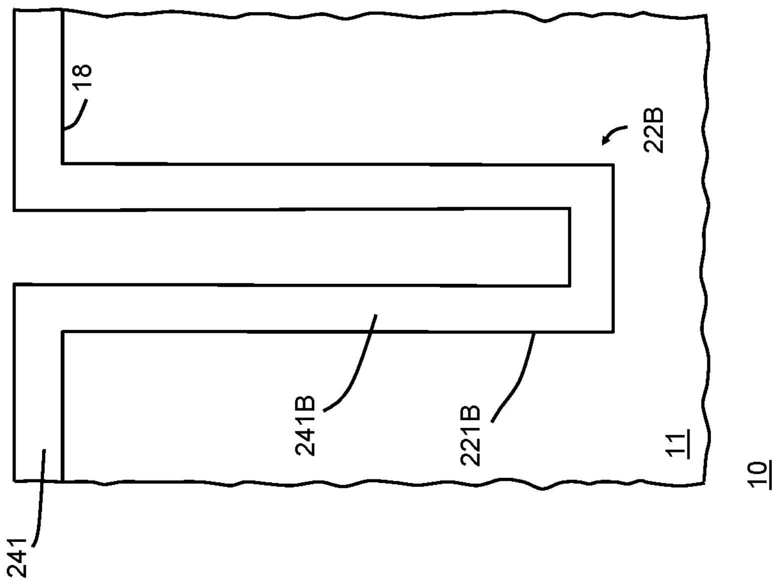
FIGS. 8A, 8B, 8C, 8D, 8E, 8F, 8G, 8H, 8I, 8J, 8K, 8L, 8I, 8M, and 8N illustrate partial cross-sectional views of a semiconductor device in accordance with the present description at various stages of manufacture.
Figure 8A:
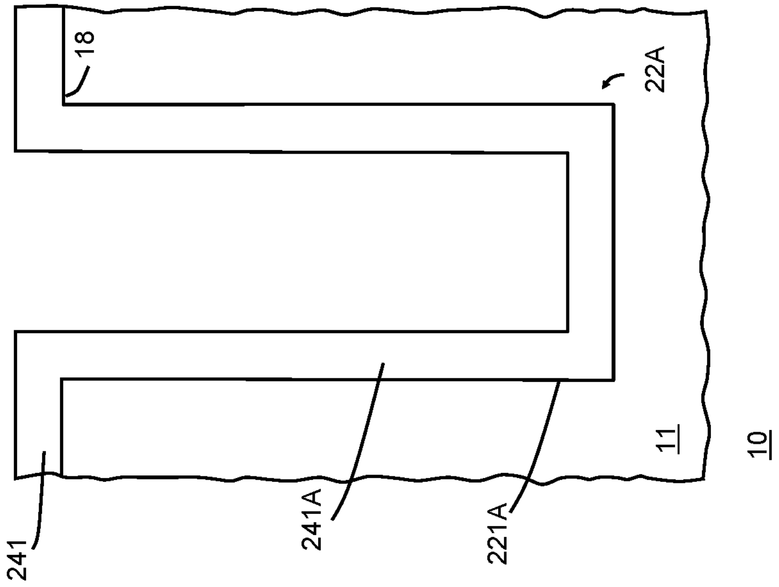

FIGS. 8A and 8B illustrate cross-sectional view of semiconductor device 10 at an early step in manufacturing. In some examples, region of semiconductor material 11 is provided with major surface 18. A masking material (not shown) can be provided over major surface 18 and patterned to provide openings for active trench 221A where active trench regions 22A will be formed, and openings for coupling trench 221B where coupling trench regions 22B will be formed. After the openings are provided, segments of region of semiconductor material 11 can be removed to provide active trench 221A and coupling trench 221B extending inward from major surface 18 into region of semiconductor material 11. In the present example, coupling trench 221B has smaller width than active trench 221A. In some examples, active trench 221A can have a width in a range from about 0.2 micron to about 1.5 microns, and coupling trench 221B can have a width that is about 50% to 80% of the width of active trench 221A. In some examples, the width of coupling trench 221B is selected using the targeted thickness of the shield dielectrics so that the shield electrodes in the coupling trench regions are in the central portion of the coupling trench regions and not in the lower portion of the coupling trench regions.

In some examples, active trench 221A and coupling trench 221B can be etched using plasma etching techniques with a fluorocarbon chemistry or a fluorinated chemistry (for example, $SF_6/O_2$) or other chemistries or removal techniques as known to those of ordinary skill in the art. In some examples, active trench 221A and coupling trench 221B can be formed using a multiple step etch process.

In some examples, doped regions 17, 17A, and 17B can be provided within region of semiconductor material 11 in the termination regions of semiconductor device 10 prior to the formation of active trench 221A and coupling trench 221B. In some examples, ion implantation and anneal techniques can be used to provide doped regions 17, 17A, and 17B. In other examples, doped regions 17, 17A, and 17B can be provided in a later manufacturing step.

Next, a dielectric 241 is provided adjacent to major surface 18 including a dielectric portion 241A adjacent to surfaces of active trench 221A and a dielectric portion 241B adjacent to surfaces of coupling trench 221B. In some examples, dielectric 241 comprises one or more dielectric materials, such as one or more oxides, one or more nitrides, combinations thereof, or other insulative materials as known to one of ordinary skill in the art. Dielectric 241 can be provided using thermal oxidation, chemical vapor deposition (CVD) techniques, plasma enhanced CVD (PECVD) techniques, low pressure CVD (LPCVD) techniques, or other techniques as known to one of ordinary skill in the art. In some examples, dielectric 241 comprises a thermal oxide and has a thickness in a range from about 0.05 microns to about 0.8 microns.

Figure 8D:
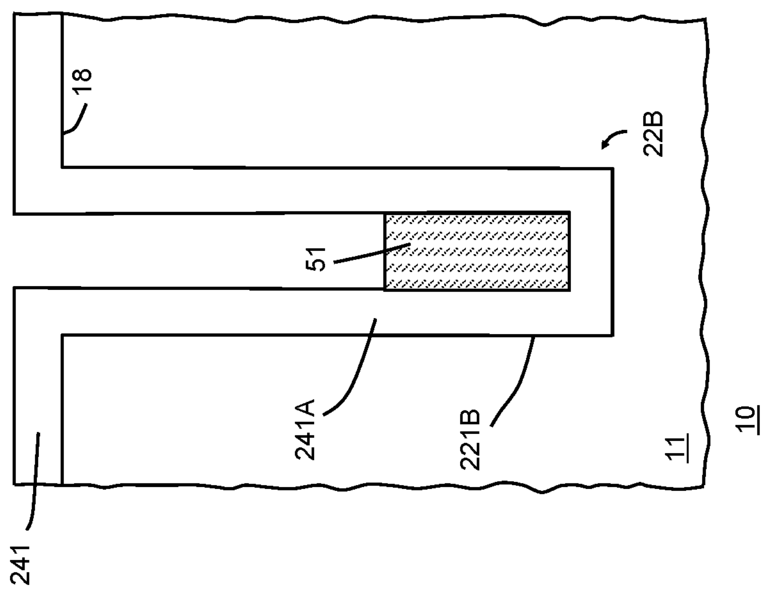
Figure 8C:
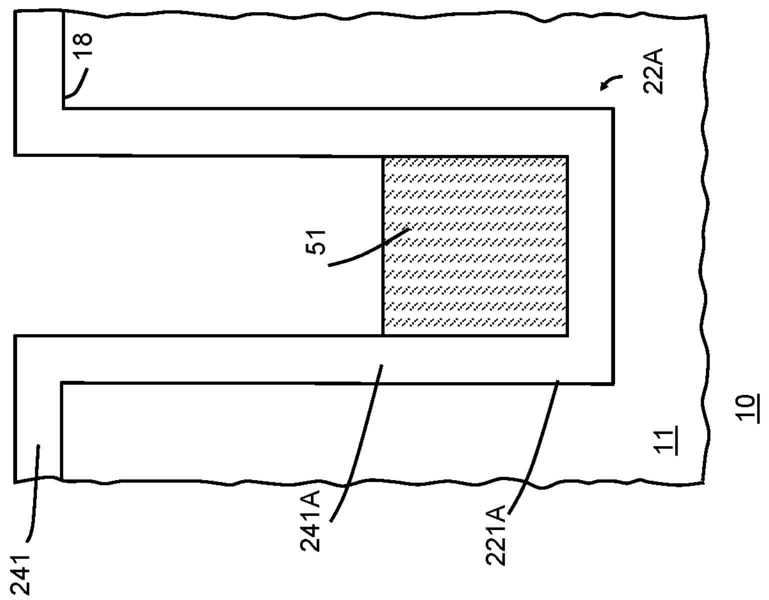

FIG. 8C and FIG. 8D illustrate partial cross-sectional views of semiconductor device 10 after additional processing. In some examples, an etch-back material 51 or other planarization material is provided over dielectric portion 241A in active trench 221A and over dielectric portion 241B in coupling trench 221B. In some examples, etch back material 51 comprises an organic material, such as a photoresist. In the present example, etch back material 51 is provided in lower portions of active trench 221A and coupling trench 221B.

Figure 8F:
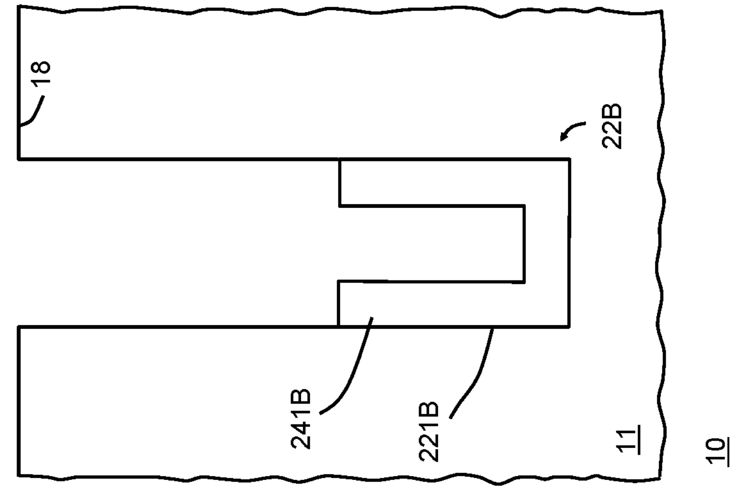
Figure 8E:
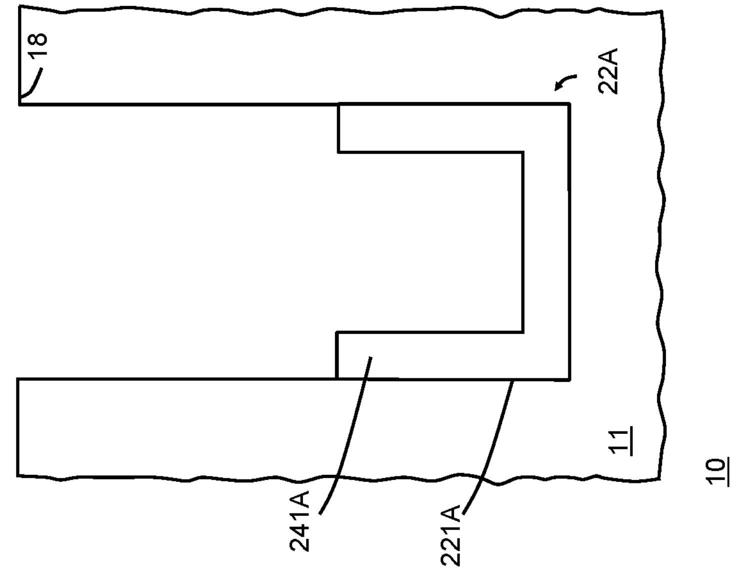

FIG. 8E and FIG. 8F illustrate partial cross-sectional view of semiconductor device 10 after additional processing. In some examples, part of dielectric portion 241A and part of dielectric portion 241B are removed to a location proximate to etch-back material 51. In some examples, dry etching techniques can be used to remove the upper parts of dielectric portion 241A and dielectric portion 241B. In other examples, wet etching techniques can be used to remove the upper portions of dielectric portions 241A and 241B. After the upper parts of dielectric portions 241A and 241B are removed, etch back material 51 can be removed. This step also removes dielectric 241 adjacent to major surface 18. In other examples, only a portion of dielectric 241 is removed leaving some of dielectric 241 along the upper portions of active trench 221A and coupling trench 221B and along major surface 18.

Figure 8H:
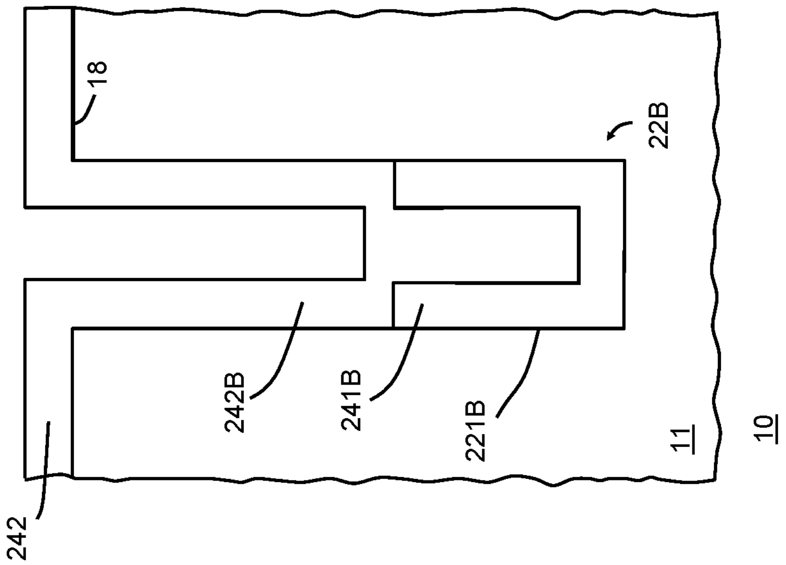
Figure 8G:
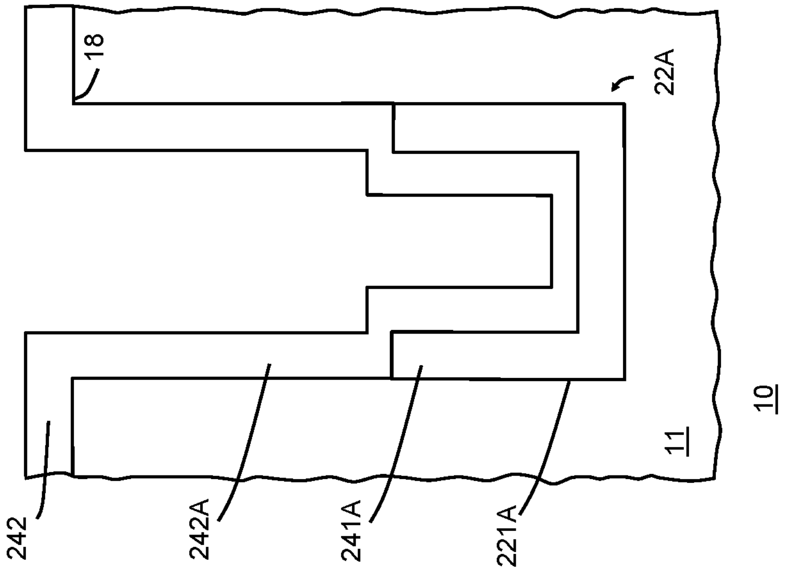

FIG. 8G and FIG. 8H illustrate partial cross-sectional view of semiconductor device 10 after additional processing. In some examples, a dielectric 242 is provided adjacent to major surface 18 including a dielectric portion 242A adjacent to upper surfaces of active trench 221A and a dielectric portion 242B adjacent to upper surfaces of coupling trench 221B. In some examples, dielectric 242 comprises a deposited dielectric having a thickness that fills the lower portion of coupling trench 221B but leaves a central portion and a lower portion of active trench 221A unfilled. A central portion of coupling trench 221B is left unfilled with dielectric portion 242B. In some examples, dielectric 242 comprises a deposited oxide and can have a thickness in a range from about 0.05 microns to about 1.0 microns.

Figure 8J:
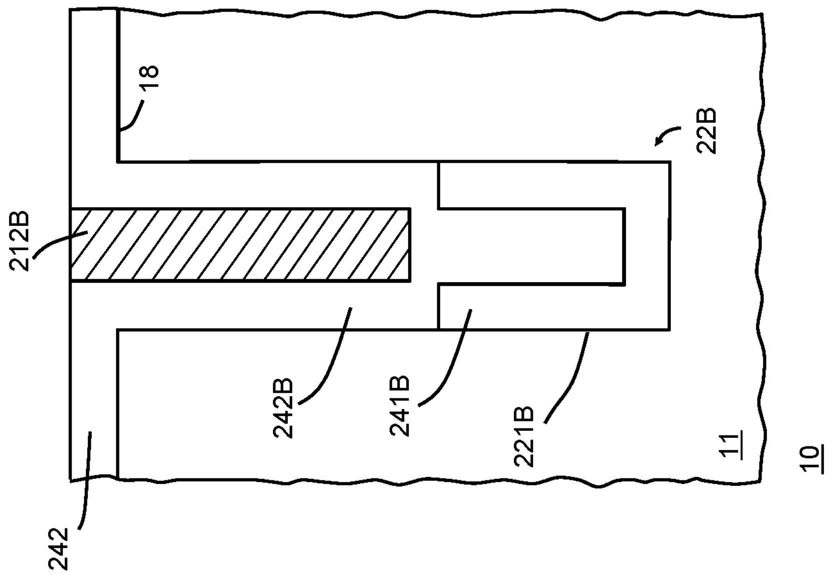
Figure 8I:
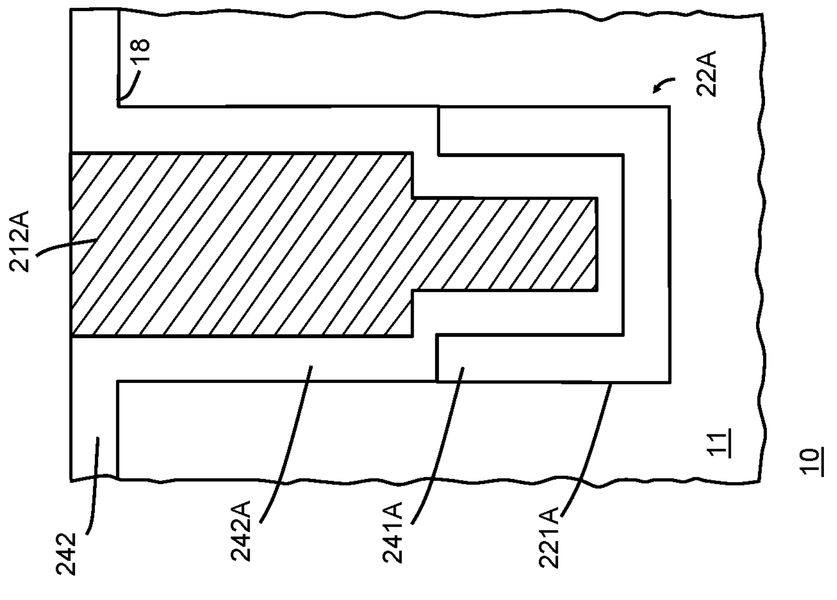

FIG. 8I and FIG. 8J illustrate partial cross-sectional views of semiconductor device 10 after additional processing. In some examples, a conductive material is provided adjacent to major surface 18 and within active trench 221A and within coupling trench 221B. In some examples, the conductive material can comprise a crystalline material, a conductor, or combinations thereof. In some examples, the conductive material can be doped polysilicon. In some examples, the doped polysilicon can be doped with an N-type conductivity dopant, such as phosphorous or arsenic. In a subsequent step, the conductive material can be planarized to provide the structures 212A and 212B shown in FIGS. 8I and 8J. In some examples, chemical mechanical planarization (CMP) techniques can be used for the planarization step. When the conductive material for structures 212A and 212B includes crystalline semiconductor material, the conductive material can be heat treated before or after planarization to anneal, activate and/or diffuse any dopant material present in the doped crystalline semiconductor material.

Figure 8K:
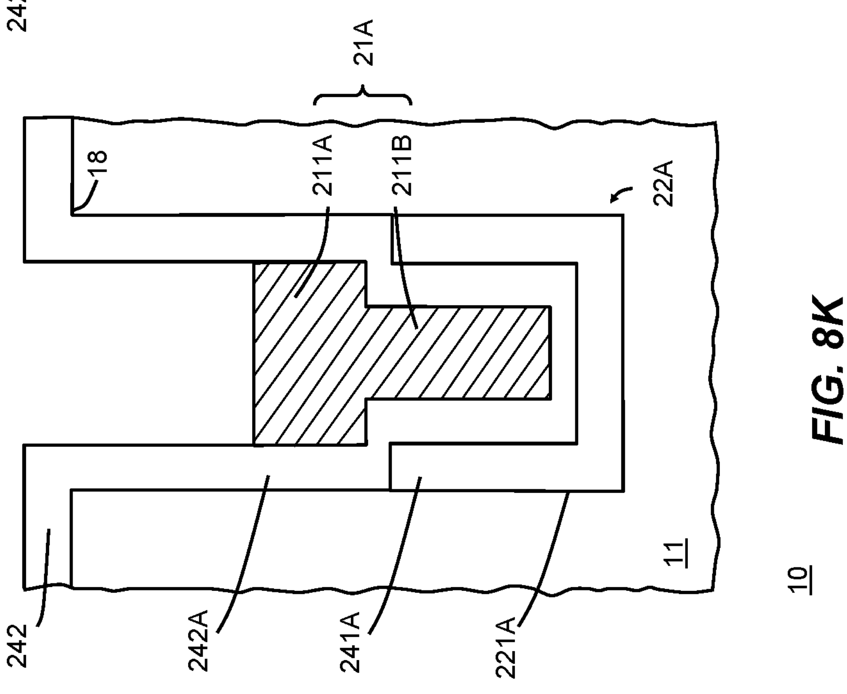
Figure 8L:
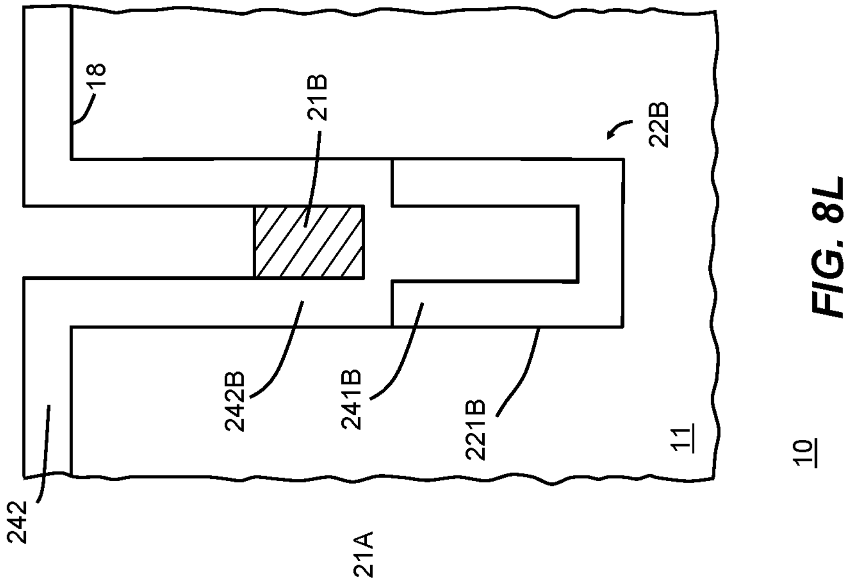

FIGS. 8K and 8L illustrate partial cross-sectional views of semiconductor device 10 after additional processing. In some examples, structure 212A can be recessed within active trench 221A to form active shield electrode 21A, and structure 212B can be recessed within coupling trench 221B to form coupling shield electrode 21B. In some examples, a dry etch with a fluorine or chlorine based chemistry can be used for the recess step when active shield electrode 21A and coupling shield electrode 21B comprise doped polysilicon. In accordance with the present description, coupling shield electrode 21B is in a central portion of coupling trench 221B but not in a lower portion of coupling trench 221B. That is, the lower portion of coupling trench 221B is devoid coupling shield electrode 21B. Active shield electrode 21A comprises a portion 211A in a central portion of active trench 221A and a portion 211B in a lower portion of active trench 221A.

Figure 8N:
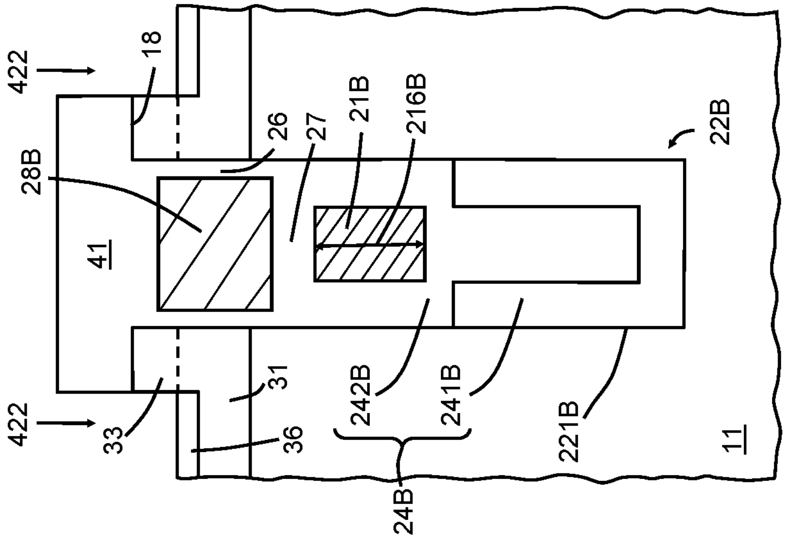
Figure 8M:
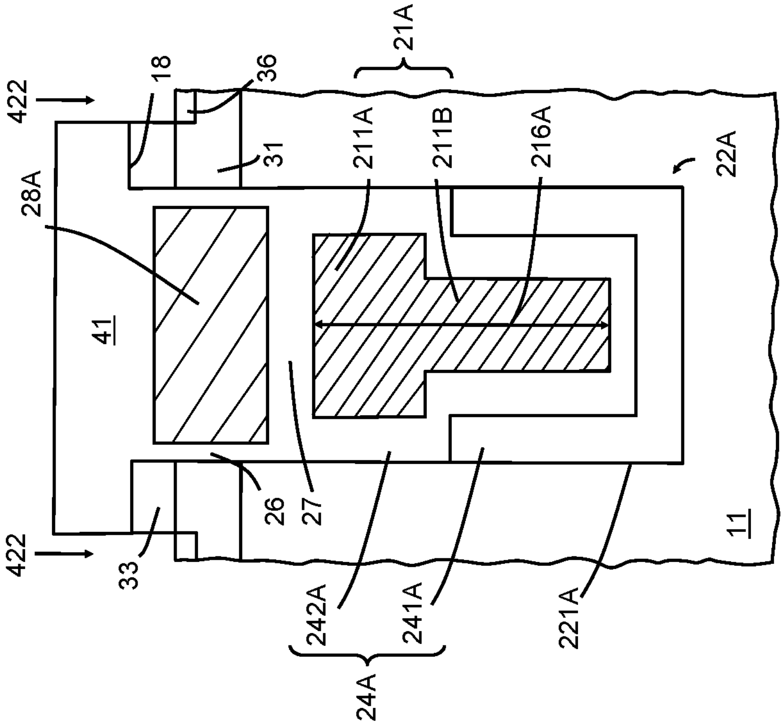

FIG. 8M and FIG. 8N illustrate partial cross-sectional views of semiconductor device 10 after additional processing. In some examples, exposed portions of dielectric 242 (including parts of dielectric portion 242A and parts of dielectric portions 242B) can be removed. In other examples, portions of dielectric 242 can be left in place or thinned to a preselected thickness to become part of gate dielectric 26. In some examples, a dielectric can be formed within active trench 221A and within coupling trench 221B adjacent to active shield electrode 21A and adjacent to coupling shield electrode 21B respectively to provide gate dielectric 26 and inter-electrode dielectric 27. Gate dielectric 26 and inter-electrode dielectric 27 can be oxides, nitrides, tantalum pentoxide, titanium dioxide, barium strontium titanate, high k dielectric materials, combinations thereof, or other related or equivalent materials known by one of ordinary skill in the art. In some examples, gate dielectric 26 and inter-electrode dielectric 27 can be an oxide. In some examples, gate dielectric 26 can have a thickness from about 0.02 microns to about 0.1 microns, and inter-electrode dielectric 27 can have a thickness that is greater than that of gate dielectric 26. In some examples, dielectric portions 241A and 242A provide active shield dielectric 24A, which separates active shield electrode 21A from region of semiconductor material 11, and dielectric portions 241B and 242B provide coupling shield dielectric 24B, which separates coupling shield electrode 21B from region of semiconductor material 11. In some examples, active shield dielectric 24A and coupling shield dielectric 24B can have a greater thickness than gate dielectric 26 and inter-electrode dielectric 27. Active shield electrode 21A comprises active shield electrode thickness 216A and coupling shield electrode 21B comprises coupling shield electrode thickness 216B, which is less than active shield electrode thickness 216A. That is, coupling shield electrode 21B is thinner or shorter than active shield electrode 21A. Active shield electrode 21A and coupling shield electrode 21B are coupled together and coupled to shield contact trenches 210 of, for example, cell topography 100 illustrated in FIG. 1.

Additional processing provides semiconductor device 10 comprising active gate electrode 28A and coupling gate electrode 28B, which can be coupled together and coupled to gate contact trenches 280 through intersecting gate electrode 28C of, for example, cell topography 100 illustrated in FIG. 1. In some examples, active gate electrode 28A and coupling gate electrode 28B can comprise crystalline semiconductor material, a conductive material, or combinations thereof. In some examples, the active gate electrode 28A and coupling gate electrode can be doped polysilicon. In some examples, the polysilicon can be doped with an N-type dopant, such as phosphorous or arsenic. In some examples, active gate electrode 28A and coupling gate electrode 28B can be recessed below major surface 18 of region of semiconductor material 11. In some examples, active gate electrode 28A and coupling gate electrode 28B can be recessed about 0.15 microns to about 0.25 microns below major surface 18. The upper surface of active gate electrode 28A and coupling gate electrode 28B can be substantially flat or can have convex or concave shapes in a cross-sectional view.

Body region 31 can be formed extending from major surface 18 adjacent to active trench 221A and coupling trench 221B. In the present example, body region 31 comprises P-type conductivity and can be formed using, for example, a boron dopant source. Body region 31 has a dopant concentration suitable for forming inversion layers that operate as channel regions 45 (illustrated, for example, in FIG. 2) of semiconductor device 10. Body region 31 can extend from major surface 18 to a depth, for example, from about 0.3 microns to about 1.0 microns. It is understood that body region 31 can be formed at an earlier stage of manufacturing, for example, before active trench 221A and coupling trench 221B are formed. Body region 31 can be formed using doping techniques, such as ion implantation and anneal techniques.

Doped regions 33 can be formed within, in, or adjacent to body region 31 and can extend from major surface 18 to a depth for example, from about 0.2 microns to about 0.4 microns. In the present example, doped regions 33 have an N-type conductivity and can be formed using, for example, a phosphorous or arsenic dopant source. In some examples, an ion implant doping process can be used to form doped regions 33 within body region 31 using a masking layer. The masking layer can then be removed, and the implanted dopant can be annealed. As described previously, doped regions 33 are optionally provided adjacent to coupling trench regions 22B as represented by the dashed lines in FIG. 8N.

Interlayer dielectric 41 can be formed adjacent to major surface 18. In some examples, interlayer dielectric 41 comprises one or more dielectric or insulative layers. In some examples, interlayer dielectric 41 comprises silicon oxides, such as doped or undoped deposited silicon oxides. In other examples, interlayer dielectric 41 comprises one layer of deposited silicon oxide doped with phosphorous or boron and phosphorous and one layer of undoped oxide. Interlayer dielectric 41 can have a thickness from about 0.3 microns to about 1.0 microns and can be planarized to provide a more uniform surface topography, which improves manufacturability.

Subsequently, a masking layer (not shown) can be formed adjacent to major surface 18, and openings can be formed for making contact trenches 422, which provide contact to doped regions 33 and provide an opening for forming body contact regions 36. In some examples, a recess etch can be used to remove portions of doped regions 33. The recess etch step can expose portions of body region 31 below doped regions 33. The masking layer can be subsequently removed. Body contact regions 36 can be formed in body regions 31, which can be configured to provide a lower contact resistance to body regions 31. Ion implantation (for example, using boron) and anneal techniques can be used to form body contact regions 36.

Additional processing can be used to provide conductive regions 43 within contact trenches 422 and configured to provide electrical contact to doped regions 33 and body regions 31 through body contact regions 36 as illustrated, for example, in FIGS. 2 and 3. In some examples, conductive regions 43 can be conductive plugs or plug structures. In some examples, conductive regions 43 can include a conductive barrier structure or liner and a conductive fill material. The barrier structure can include a metal/metal-nitride configuration, such as titanium/titanium-nitride or other related or equivalent materials as known by one of ordinary skill in the art. The barrier structure can further include a metal-silicide structure. In some examples, the conductive fill material includes tungsten. In some examples, conductive regions 43 can be planarized to provide a more uniform surface topography. Further processing can be used to provide conductors 44 and 46 and described previously.

As described previously similar processing can be used to provide intersecting trench region 22CA illustrated in FIG. 9A and intersecting trench region 22CB illustrated in FIG. 9B. In some examples, intersecting trench region 22CA comprises intersecting shield dielectric 24C including dielectric portions 241C and 242C, which can be similar to dielectric portions 241A and 242A. In some examples, intersecting trench region 22CB comprises intersecting shield dielectric 24C' including dielectric portions 241C' and 242C', which can be similar to dielectric portions 241B and 242B. Intersecting shield dielectric 24C separates intersecting shield electrode 21C from region of semiconductor material 11. Intersecting shield dielectric 24C' separates intersecting shield electrode 21C' from region of semiconductor material 11. Intersecting shield electrode 21C comprises a portion 211C in a central portion of intersecting trench region 22CA and a portion 211D in a lower portion of intersecting trench region 22CA. Portions 211C and 211D can be similar to portions 211A and 211B of active shield electrode 21A described previously. Intersecting shield electrode 21C' is within a central portion of intersecting trench region 22CB but is not in a lower portion of intersecting trench region 22CB. That is, the lower portion of intersecting trench region 22CB is devoid of intersecting shield electrode 21C'.

In some examples, active shield electrodes 21A, coupling shield electrodes 21B, intersecting shield electrodes 21C/21C' are coupled together and coupled to shield contact trenches 210. In some examples, active gate electrodes 28A, coupling gate electrode 28B, intersecting gate electrode 28C/28C' are coupled together and coupled to gate contact trenches 280. In some examples, body region 31 adjacent to intersecting trench regions 22CA/22CB are devoid of doped regions 33 and body contact regions 36 as illustrated, for example, in FIGS. 9A and 9B.

In summary, a semiconductor device having improved $BV_{DSS}$ performance and associated methods have been described. The semiconductor device comprises active trench regions, an intersecting trench region, and coupling trench regions connecting the active trench regions to the intersecting trench region. In some examples, the intersecting trench region or the coupling trench regions comprises a shield electrode that is shorter than the shield electrodes in the active region regions. The shorter shield electrodes reduce the effects of three-dimensional depletion proximate to the intersecting trench region thereby improving $BV_{DSS}$ performance. In some examples, termination mesa regions are provided having widths greater than the active mesa regions to provide charge balance control in the termination mesa regions to further improve $BV_{DSS}$ performance. In some examples, one or more doped regions is provided within the termination regions to further provide charge balance control to further improve $BV_{DSS}$ performance. The structures and methods support using multiple shield electrode contact trenches, which reduces shield resistance. The reduced shield resistance provides a semiconductor device with low gate bounce, good UIS performance, and higher efficiencies.

It is understood that the different examples described herein can be combined with any of the other examples described herein to obtain different implementations.

While the subject matter of this disclosure is described with specific representative examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the disclosure. Furthermore, while some examples described herein include some, but not other features included in other examples, combinations of features of different examples are meant to be within the scope of the disclosure and meant to form different examples as would be understood by those skilled in the art.

What is claimed is:

1. A semiconductor device, comprising:

a region of semiconductor material;

a first active trench region extending inward into the region of semiconductor material and comprising an active shield electrode in the first active trench region and separated from the region of semiconductor material by an active shield electrode dielectric;

a second active trench region extending inward into the region of semiconductor material, laterally spaced apart from and parallel to the first active trench region, and comprising the active shield electrode in the second active trench region and separated from the region of semiconductor material by the active shield electrode dielectric;

an intersecting trench region extending inward into the region of semiconductor material and perpendicular to the first active trench region and the second active trench region;

a first coupling trench region coupling the first active trench region to the intersecting trench region and comprising a first coupling trench having a first trench bottom and a coupling shield electrode within the first coupling trench region and separated from the region of semiconductor material by a coupling shield electrode dielectric; and a second coupling trench region coupling the second active trench region to the intersecting trench region and comprising a second coupling trench having a second trench bottom and the coupling shield electrode within the second coupling trench region and separated from the region of semiconductor material by the coupling shield electrode dielectric;

wherein:

the active shield electrode comprises a first thickness in a first cross-sectional view;

the coupling shield electrode comprises a second thickness in the first cross-sectional view;

the second thickness is less than the first thickness;

the coupling shield electrode dielectric extends from the first trench bottom and the second trench bottom to a depth above the first trench bottom and the second trench bottom; and the coupling shield electrode is disposed above the coupling shield electrode dielectric such that a portion of each of the first coupling trench region and the second coupling trench region extending from the first trench bottom and the second trench bottom toward a top side of the region of semiconductor material is devoid of the coupling shield electrode.

2. The semiconductor device of claim 1, wherein:

the intersecting trench region comprises an intersecting shield electrode in a lower portion of the intersecting trench region and separated from the region of semiconductor material by an intersecting shield electrode dielectric; and the intersecting shield electrode comprises a third thickness.

3. The semiconductor device of claim 2, wherein:

the third thickness is equal to the second thickness.

4. The semiconductor device of claim 2, wherein:
the third thickness is equal to the first thickness.

5. The semiconductor device of claim 1, wherein:
the intersecting trench region comprises:
a first portion comprising a first width in a top plan view;
a second portion coupling to the first portion and comprising a second width in the top plan view;
a first intersecting shield electrode in a lower portion of the first portion of the intersecting trench region and separated from the region of semiconductor material by a first intersecting shield electrode dielectric; and
a second intersecting shield electrode in a lower portion of the second portion of the intersecting trench region and separated from the region of semiconductor material by a second intersecting shield electrode dielectric;
the first intersecting shield electrode comprises a third thickness in a second cross-sectional view;
the second intersecting shield electrode comprises a fourth thickness in the second cross-sectional view;
the second width is less than the first width; and
the fourth thickness is less than the third thickness.

6. The semiconductor device of claim 5, wherein:
the fourth thickness is equal to the second thickness.

7. The semiconductor device of claim 5, wherein:
the third thickness is equal to the first thickness.

8. The semiconductor device of claim 1, further comprising:
an active mesa region interposed between the first active trench region and the second active trench region and comprising an active mesa region width;
a termination mesa region interposed between the first coupling trench region and the second coupling trench region and abutting the intersecting trench region;
a base region within the active mesa region and the termination mesa region; and
a body contact region within the base region, the body contact region comprising a tip region in the termination mesa region;
wherein:
the termination mesa region comprises a termination mesa region width greater than the active mesa region width.

9. The semiconductor device of claim 1, further comprising:
a shield contact trench;
a gate contact trench;
a third coupling trench region coupling the shield contact trench to the intersecting trench region and comprising the coupling shield electrode within the third coupling trench region and separated from the region of semiconductor material by the coupling shield electrode dielectric; and
a fourth coupling trench region coupling the gate contact trench to the intersecting trench region and comprising the coupling shield electrode within the fourth coupling trench region and separated from the region of semiconductor material by the coupling shield electrode dielectric.

10. A semiconductor device, comprising:
a region of semiconductor material comprising a top side and a first conductivity type;
a first active trench region within the region of semiconductor material and comprising an active shield electrode separated from the region of semiconductor material by an active shield electrode dielectric;
an intersecting trench region within the region of semiconductor material and perpendicular to the first active trench region and comprising an intersecting shield electrode separated from the region of semiconductor material by an intersecting shield electrode dielectric; and
a first coupling trench region within the region of semiconductor material coupling the first active trench region to the intersecting trench region and comprising a coupling shield electrode separated from the region of semiconductor material by a coupling shield electrode dielectric;
wherein:
the active shield electrode comprises a first thickness in a first cross-sectional view;
the coupling shield electrode comprises a second thickness in the first cross-sectional view;
the intersecting shield electrode comprises a third thickness in a second cross- sectional view;
the second thickness is less than the first thickness; and
the third thickness is equal to the first thickness.

11. The semiconductor device of claim 10, further comprising:
a second active trench region within the region of semiconductor material, laterally spaced apart from and parallel to the first active trench region, and comprising the active shield electrode separated from the region of semiconductor material by the active shield electrode dielectric;
an active mesa region interposed between the first active trench region and the second active trench region and comprising an active mesa region width;
a second coupling trench region within the region of semiconductor material coupling the second active trench region to the intersecting trench region and comprising the coupling shield electrode separated from the region of semiconductor material by the coupling shield electrode dielectric;
a termination mesa region interposed between the first coupling trench region and the second coupling trench region and abutting the intersecting trench region;
a base region comprising a second conductivity type opposite to the first conductivity type within the active mesa region and the termination mesa region; and
a doped region in the termination mesa region below the base region between the first coupling trench region and the second coupling trench region.

12. The semiconductor device of claim 11 wherein:
the region of semiconductor material comprises a substrate and a semiconductor region over the substrate;
the doped region comprises the first conductivity type;
the doped region comprises a first peak dopant concentration;
the semiconductor region comprises a second peak dopant concentration; and
the first peak dopant concentration is greater than the second peak dopant concentration.

13. The semiconductor device of claim 11, wherein:
the doped region comprises the second conductivity type.

14. The semiconductor device of claim 10, further comprising:
an active gate electrode in an upper portion of the first active trench region and separated from the region of semiconductor material by a gate dielectric; and
a coupling gate electrode in an upper portion of the first coupling trench region and separated from the region of semiconductor material by the gate dielectric, wherein the coupling gate electrode is coupled to the active gate electrode.

15. The semiconductor device of claim 14, further comprising:

an intersecting gate electrode in an upper portion of the intersecting trench region and separated from the region of semiconductor material by the gate dielectric, wherein the intersecting gate electrode is coupled to the coupling gate electrode and the active gate electrode.

16. The semiconductor device of claim 10, wherein:

the first coupling trench region and the intersecting trench region are disposed proximate to a termination region of the semiconductor device.

17. A method of manufacturing a semiconductor device, comprising:

providing a region of semiconductor material;

providing a first active trench region extending inward into the region of semiconductor material and comprising an active shield electrode in the first active trench region and separated from the region of semiconductor material by an active shield electrode dielectric;

providing a second active trench region extending inward into the region of semiconductor material, laterally spaced apart from and parallel to the first active trench region, and comprising the active shield electrode in the second active trench region and separated from the region of semiconductor material by the active shield electrode dielectric;

providing an intersecting trench region extending inward into the region of semiconductor material and perpendicular to the first active trench region and the second active trench region;

providing a first coupling trench region coupling the first active trench region to the intersecting trench region and comprising a first coupling trench having a first trench bottom and a coupling shield electrode separated from the region of semiconductor material by a coupling shield electrode dielectric; and providing a second coupling trench region coupling the second active trench region to the intersecting trench region and comprising a second coupling trench having a second trench bottom and the coupling shield electrode in the second coupling trench region and separated from the region of semiconductor material by the coupling shield electrode dielectric;

wherein:

the active shield electrode comprises a first thickness in a first cross-sectional view;

the coupling shield electrode comprises a second thickness in the first cross-sectional view;

the second thickness is less than the first thickness;

the coupling shield electrode dielectric extends from the first trench bottom and the second trench bottom to a depth above the first trench bottom and the second trench bottom; and the coupling shield electrode is disposed above the coupling shield electrode dielectric such that a portion of each of the first coupling trench region and the second coupling trench region extending from the first trench bottom and the second trench bottom toward a top side of the region of semiconductor material is devoid of the coupling shield electrode.

18. The method of claim 17, wherein providing the intersecting trench region comprises:

providing an intersecting trench having an intersecting trench bottom;

providing an intersecting shield electrode dielectric in the intersecting trench; and providing an intersecting shield electrode in the intersecting trench;

wherein:

the intersecting shield electrode dielectric separates the intersecting shield electrode from the region of semiconductor material;

the intersecting shield electrode comprises a third thickness; and the intersecting shield electrode is disposed above the intersecting shield electrode dielectric such that a portion of the intersecting trench region extending from the intersecting trench bottom toward a top side of the region of semiconductor material is devoid of the intersecting shield electrode.

19. The method of claim 18, wherein:

providing the intersecting shield electrode comprises providing the third thickness equal to the second thickness.

20. The method of claim 18, wherein:

providing the intersecting shield electrode comprises providing the third thickness equal to the first thickness.

* * * * *